United States Patent
Takahashi et al.

(10) Patent No.: US 10,944,927 B2
(45) Date of Patent: Mar. 9, 2021

(54) SEMICONDUCTOR STRUCTURE AND OPERATING METHOD FOR IMPROVING CHARGE TRANSFER OF IMAGE SENSOR DEVICE

(71) Applicant: TAIWAN SEMICONDUCTOR MANUFACTURING COMPANY LTD., Hsinchu (TW)

(72) Inventors: Seiji Takahashi, Hsinchu (TW); Jhy-Jyi Sze, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 183 days.

(21) Appl. No.: 15/650,270

(22) Filed: Jul. 14, 2017

(65) Prior Publication Data
US 2019/0020835 A1    Jan. 17, 2019

(51) Int. Cl.
| | |
|---|---|
| *H04N 5/359* | (2011.01) |
| *H04N 5/378* | (2011.01) |
| *H01L 27/146* | (2006.01) |
| *H04N 5/3745* | (2011.01) |

(52) U.S. Cl.
CPC ....... *H04N 5/3594* (2013.01); *H01L 27/1461* (2013.01); *H01L 27/1463* (2013.01); *H01L 27/14607* (2013.01); *H01L 27/14612* (2013.01); *H01L 27/14643* (2013.01); *H04N 5/378* (2013.01); *H04N 5/3745* (2013.01); *H01L 27/1464* (2013.01)

(58) Field of Classification Search
CPC .......... H04N 5/335–378; H04N 5/374–37457; H01L 27/146–14893; H01L 2225/06503–06596; H01L 27/14643–14663
USPC ....... 348/294–324, 308; 250/208.1; 257/225–234, 257, 258, 291–294, 257/431–448
See application file for complete search history.

(56) References Cited

U.S. PATENT DOCUMENTS

| | | | |
|---|---|---|---|
| 8,614,759 B2 | 12/2013 | Watanabe et al. | |
| 8,785,831 B2* | 7/2014 | Krymski | H01L 27/14607 250/208.1 |
| 2004/0036789 A1* | 2/2004 | Shinohara | H01L 27/14603 348/308 |
| 2005/0128327 A1* | 6/2005 | Bencuya | H01L 27/14603 348/308 |
| 2006/0146159 A1* | 7/2006 | Farrier | H01L 27/14603 348/308 |
| 2006/0221667 A1* | 10/2006 | Ogura | H01L 27/14625 365/149 |

(Continued)

*Primary Examiner* — Xi Wang
(74) *Attorney, Agent, or Firm* — WPAT, P.C., Intellectual Property Attorneys; Anthony King

(57) ABSTRACT

An image sensor semiconductor device includes a semiconductor substrate and a first photodiode disposed in the semiconductor substrate and configured to generate charges in response to radiation. The image sensor semiconductor device also includes a first transistor disposed adjacent to the first photodiode, and a second transistor disposed over the first photodiode, wherein the first transistor and the second transistor are configured to generate at least one electric field to move the charges generated by the first photodiode. The image sensor device further includes a floating diffusion region configured to store the moved charges.

17 Claims, 17 Drawing Sheets

(56) References Cited

U.S. PATENT DOCUMENTS

| | | | |
|---|---|---|---|
| 2007/0018267 A1* | 1/2007 | Altice, Jr. | H01L 27/14609 257/445 |
| 2008/0036888 A1* | 2/2008 | Sugawa | H04N 5/2355 348/294 |
| 2014/0264270 A1* | 9/2014 | Dutta | H01L 27/14636 257/14 |
| 2016/0142653 A1* | 5/2016 | Cho | H04N 5/3532 348/296 |
| 2016/0155774 A1* | 6/2016 | Hasegawa | H01L 27/14623 257/231 |
| 2019/0075261 A1* | 3/2019 | Machida | H04N 5/341 |

\* cited by examiner

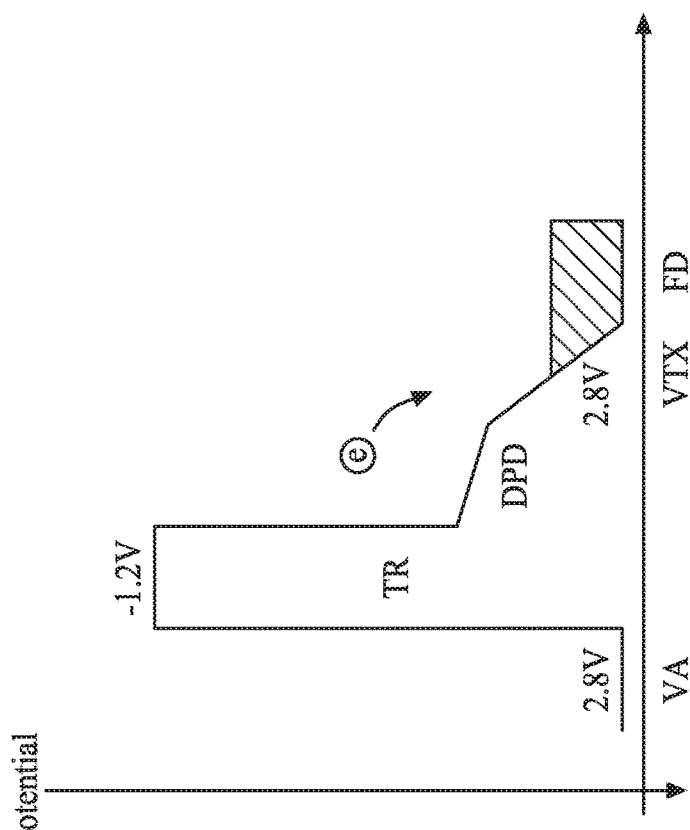
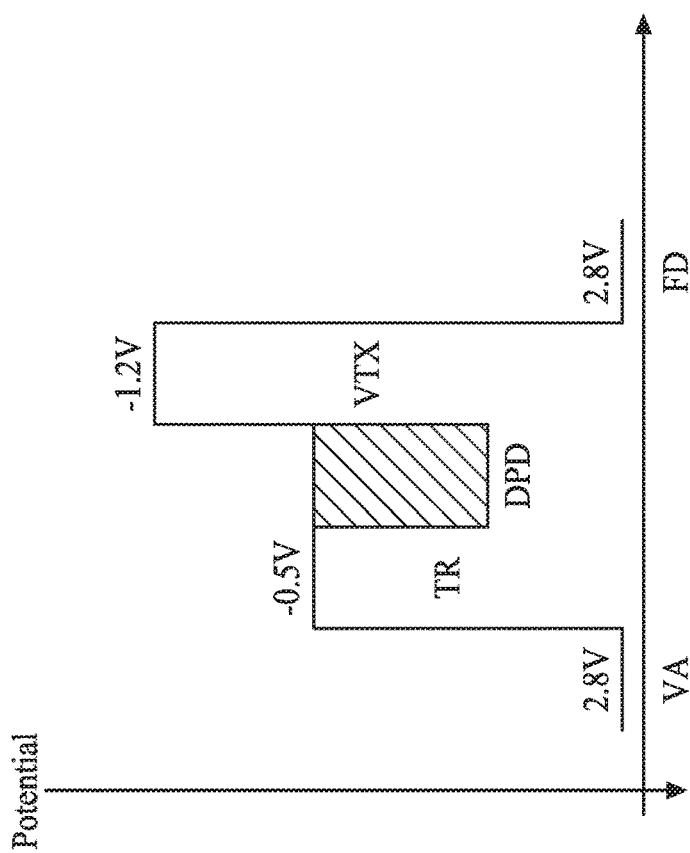

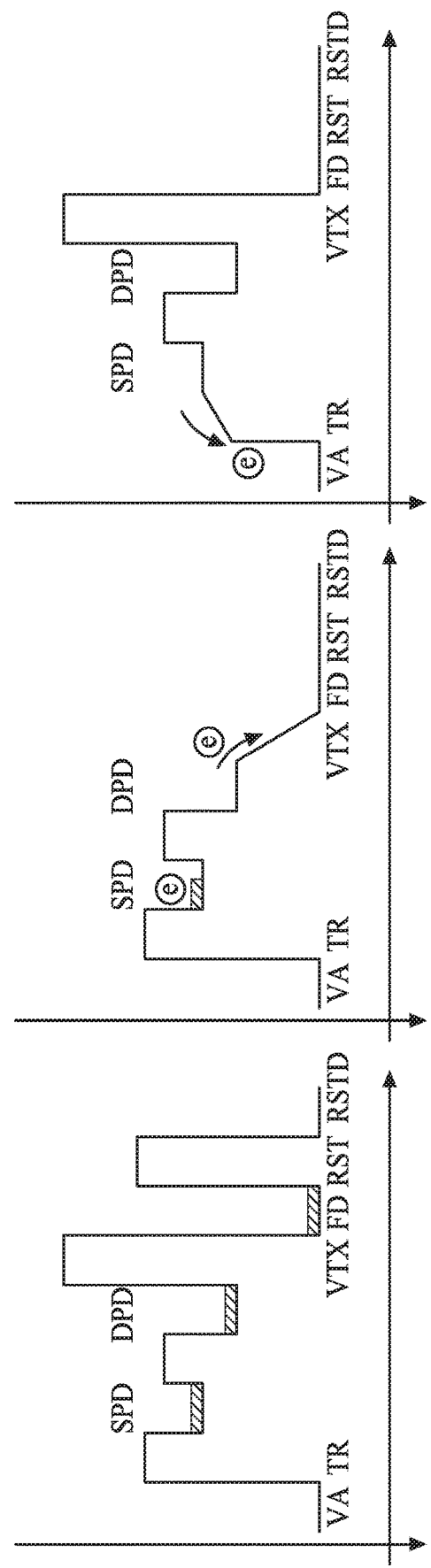

SEMICONDUCTOR STRUCTURE AND OPERATING METHOD FOR IMPROVING CHARGE TRANSFER OF IMAGE SENSOR DEVICE

BACKGROUND

As technologies evolve, complementary metal-oxide semiconductor (CMOS) image sensors are attracting more attention due to performance advantages. For example, CMOS image sensors can provide higher image acquisition rates, lower operating voltages, lower power consumption and greater noise immunity. A CMOS image sensor usually comprises an array of light-sensing elements or pixels. Each of the pixels is configured to convert received photons into electrons. Additionally, the CMOS image sensor comprises circuitry to transform the electrons into electrical signals. The electrical signals are then processed to generate an image of a subject scene.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4C through 4F are schematic potential diagrams associated with the readout operation in FIG. 4A, in accordance with some embodiments.

FIGS. 5B, 5C and 5D are schematic potential diagrams associated with the shutter operation in FIG. 5A, in accordance with some embodiments.

DETAILED DESCRIPTION

Figure 1A:
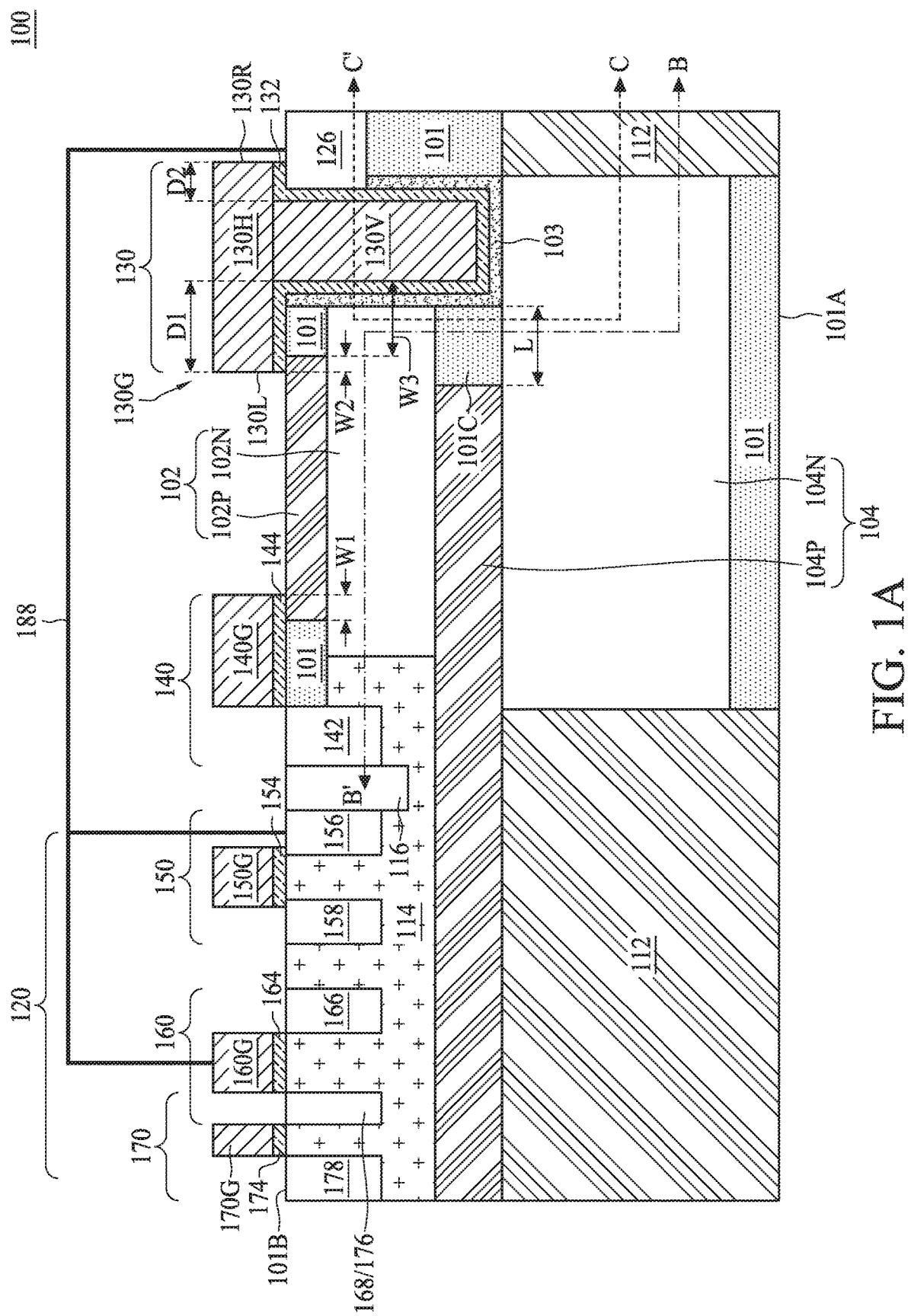
FIGS. 1A and 1B are a schematic cross-sectional view and a schematic plan view, respectively, of an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor image sensor device and operating methods thereof according to various embodiments. The performance of an image sensor is determined by several factors and the blooming effect is one of them. The maximal amount of charge of a certain photodiode in an image sensor that can be collected and detected is a fixed value. As charges are generated and collected in a photodiode of the image sensor, it may reach the photodiode well capacity. If the amount of charges exceeds the well capacity, some charges may flow out of their original pixel and enter adjacent pixels, a phenomenon referred to as blooming. The blooming effect will induce noise to the generated image, thus deteriorating image quality. The blooming effect may be more pronounced in a partially-isolated image sensor where isolation structures formed between adjacent pixels only partially demarcate pixels. Moreover, existing charge-transferring transistors may not move the generated charges efficiently and may introduce image lag accordingly. In the present disclosure, an auxiliary transistor and operating methods thereof are introduced to improve the performance of partially-isolated image sensors. Residual photocharge left in the photodiode not fully cleaned by existing charge-transferring circuits may be further drained by help of the anti-blooming transistor during the shutter phase. Additionally, the auxiliary transistor is further configured to amplify the electric field in the readout phase so as to facilitate charge transfer. As a result, the blooming effect and the image lag can be reduced.

Figure 1B:
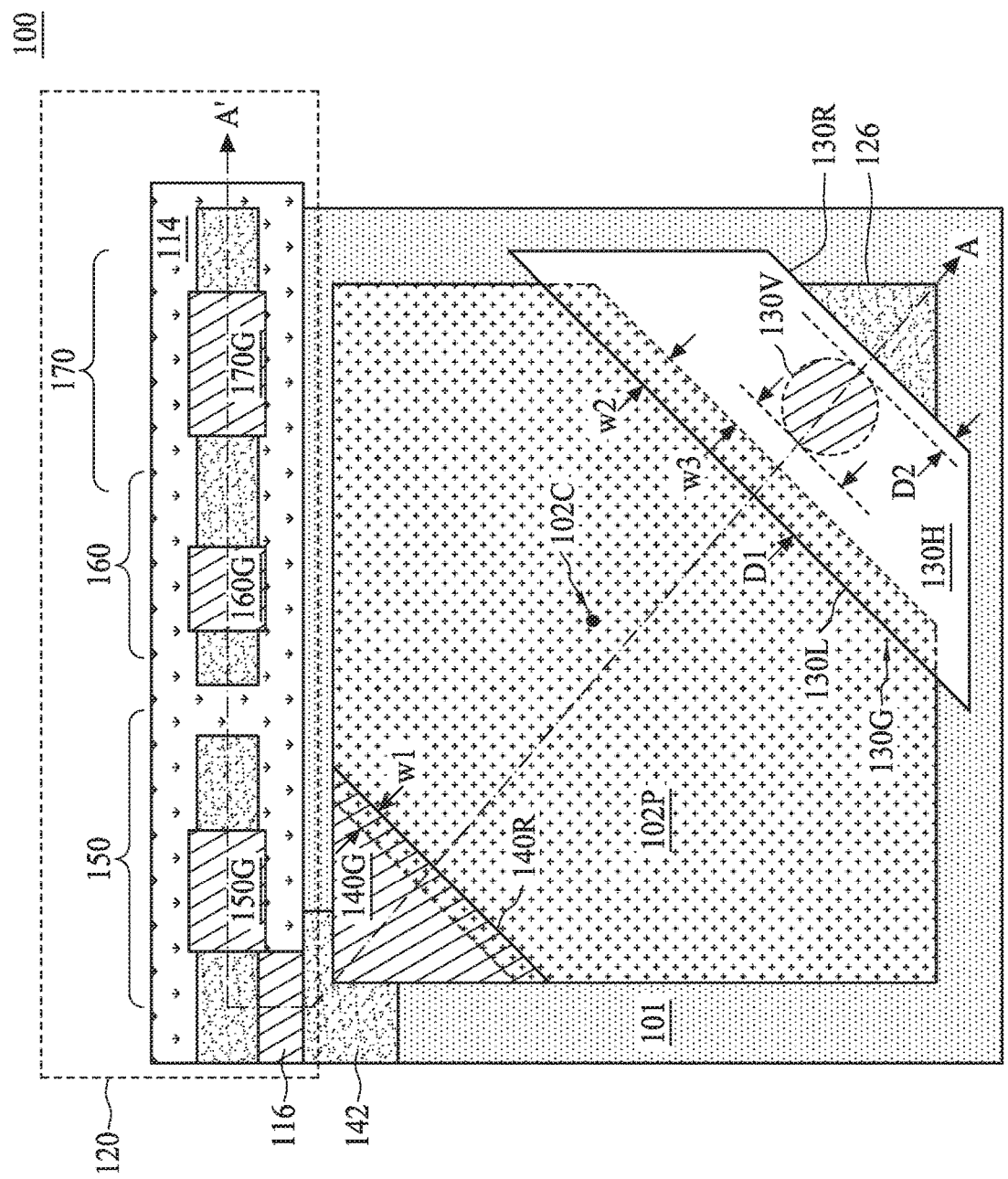

FIGS. 1A and 1B are a schematic cross-sectional view and a plan view, respectively, of an image sensor device 100, in accordance with some embodiments. The cross-sectional view shown in FIG. 1A is taken along a sectional line AA' in FIG. 1B. The image sensor device 100 may be a complementary metal-oxide-semiconductor (CMOS) image sensor or an active pixel sensor. In some embodiments, the image sensor device 100 is a charge-coupled device (CCD) or a passive pixel sensor. In some embodiments, the image sensor device 100 is a back-side illuminated (BSI) image sensor. Referring to FIG. 1A, the image sensor device 100 includes a substrate 101, a first photodiode 102, a second photodiode 104, a floating diffusion region 126, a transfer transistor 130, an auxiliary transistor 140, a reset transistor 150, an amplifier transistor 160, and a readout transistor 170. In some embodiments, the image sensor device 100 includes a unit pixel as viewed from above, wherein the unit pixel may include a vertical photodiode stack that at least comprises the first photodiode 102 and the second photodiode 104. In the depicted embodiment, only one unit pixel is illustrated. However, it is understood that an array of unit pixels arranged in rows and columns are within the contemplated scope of the present disclosure. In some embodiments, a unit pixel further includes the floating diffusion region 126 and a signal processing circuit including at least one of the transistors 130, 150, 160 and 170.

The substrate 101 includes a semiconductor material such as silicon or germanium. In some embodiments, the substrate 101 may include other semiconductor materials, such as silicon germanium, silicon carbide, gallium arsenide, gallium phosphide, indium phosphide, indium arsenide, indium antimonide, or combinations thereof. The substrate 101 may be doped with an N-type dopant, such as arsenic or phosphor, and may be doped with a P-type dopant, such as boron or the like. The substrate 101 has a first surface 101A (sometimes termed as a back side) and a second surface 101B (sometimes termed as a front side) opposite to the first surface 101A. In some embodiments, the image sensor device 100 is configured to receive radiation incident from the first surface 101A for the BSI image sensor. In some embodiments, active components, such as transistors, or passive components, such as doped regions, conductive features or dielectric layers, are formed on the second surface 101B.

The first photodiode 102 and the second photodiode 104 are formed in the substrate 101, wherein the first photodiode 102 is comprised of a first layer 102P and a second layer 102N, and the second photodiode 104 is comprised of a first layer 104P and a second layer 104N. In some embodiments, the first photodiode 102 and the second photodiode 104 are stacked along a depth direction of the substrate 101 so that the pixel well capacity can be magnified while the pixel footprint is minimized. A junction in each of the photodiodes 102 and 104 is formed between the respective first layer (102P/104P) and second layer (102N/104N), and a corresponding depletion region is established accordingly. The received radiation or photons are transformed into charges around the depletion regions of the respective photodiode. In the depicted embodiment, the substrate 101 has a P-type dopant. The first layers 102P and 104P of the respective photodiodes 102 and 104 may be doped layers having a P-type dopant. Moreover, the second layers 102N and 104N may be doped layers having an N-type dopant.

In some embodiments, the doping concentration of the first layers 102P and 104P is greater than the doping concentration of the substrate 101. In some embodiments, the first layers 102P and 104P have a doping concentration between about 1E17 atoms/cm$^3$ and about 1E19 atoms/cm$^3$. In some embodiments, the first layers 102P and 104P have a doping concentration between about 1E17 atoms/cm$^3$ and about 5E18 atoms/cm$^3$. In some embodiments, the first layers 102P and 104P have a doping concentration between about 5E17 atoms/cm$^3$ and about 5E18 atoms/cm$^3$. In some embodiments, the second layer 102N of the first photodiode 102 has a doping concentration between about 1E17 atoms/cm$^3$ and about 1E19 atoms/cm$^3$. In some embodiments, the second layer 102N of the first photodiode 102 has a doping concentration between about 1E17 atoms/cm$^3$ and about 5E18 atoms/cm$^3$. In some embodiments, the second layer 102N of the first photodiode 102 has a doping concentration between about 5E17 atoms/cm$^3$ and about 5E18 atoms/cm$^3$.

In some embodiments, the second layer 104N of the second photodiode 105 has a doping concentration between about 5E16 atoms/cm$^3$ and about 5E17 atoms/cm$^3$. In some embodiments, the second layer 104N of the second photodiode 105 has a doping concentration between about 1E17 atoms/cm$^3$ and about 5E17 atoms/cm$^3$.

An isolation structure 112 is formed in the substrate 101 for isolating a unit pixel of the image sensor device 100 from adjacent unit pixels. In some embodiments, the isolation structure 112 is exposed on the first surface 101A of the substrate 101. In some embodiments, the isolation structure 112 laterally surrounds the second layer 104N of the second photodiode 104. In some embodiments, the isolation structure 112 does not penetrate through the substrate 101; therefore, adjacent unit pixels (or photodiodes) are not fully separated. Such partial isolation structure 112 is so arranged as to be compatible with other features formed on the second surface 101B of the substrate 101. In some embodiments, the isolation structure 112 has an upper surface substantially level with the second layer 104N of the second photodiode 104. The isolation structure 112 may be formed of a doped semiconductor material, a dielectric material, or combinations thereof. The doped semiconductor material for the isolation structure 112 may be a P-type doped silicon material with a doping concentration. The dielectric material may include an oxide, a nitride, an oxynitride, silicon dioxide, a polymer material, or the like.

A transfer transistor 130 is formed on the second surface 101B. In some embodiments, the transfer transistor 130 includes a gate electrode 130G and a gate dielectric 132. The gate electrode 130G is configured to establish an electric field that moves photocharges in the photodiodes 102 and 104 to the floating diffusion region 126. The gate electrode 130G is formed of a conductive material, such as a metallic material (e.g., tungsten, copper, silver) or polysilicon. The gate electrode 130G may include a vertical portion 130V penetrating into the substrate 101 in a depth direction and a horizontal portion 130H extending over the front surface 101B of the substrate 101. The gate dielectric 132 is disposed between the gate electrode 130G and the substrate 101. The gate dielectric 132 may include silicon oxide, silicon nitride, silicon oxynitride, other suitable materials, or combinations thereof. The gate dielectric may include high-k materials such as metal oxides, metal nitrides, metal silicates, transition metal-oxides, transition metal-nitrides, transition metal-silicates, oxynitride of metals, metal aluminates, zirconium silicate, zirconium aluminate, hafnium oxide, or combinations thereof.

The horizontal portion 130H may have a first protrusion having a distance D1 measured from a first sidewall of the vertical portion 130V to a first side 130L and a second protrusion having a distance D2 measured from a second sidewall of the vertical portion 130V to a second side 130R. In some embodiments, the distances D1 and D2 are not equal. In some embodiments, the distance D1 is made greater than the distance D2 to ensure better coverage of the electric field generated by the gate electrode 130G.

The floating diffusion region 126 is disposed adjacent to the transfer transistor 130. In some embodiments, the floating diffusion region 126 is disposed on a side of the transfer transistor 130 opposite the first photodiode 102. The floating diffusion region 126 acts as a charge tank in which charges can be read out in a readout operation. In the depicted embodiment, the floating diffusion region 126 has an N-type dopant. In some embodiments, the floating diffusion region 126 has a doping concentration greater than a doping concentration of the first layer 102N or 104N.

A semiconductor region 103 is formed in the substrate 101 between the gate dielectric 132 and the first photodiode 102 or the second photodiode 104. The semiconductor region 103 surrounds a sidewall and a bottom of the vertical portion 130V. In some embodiments, the semiconductor region 103 contacts an edge of the second layer 102N of the first photodiode 102. In some embodiments, the semiconductor region 103 contacts an upper surface of the second layer 104N of the second photodiode 104. When a recess is formed in which the gate electrode 130G is to be subsequently deposited, lattice defects may be introduced around the interface of the substrate 101 and layers lined to the recess, such as the gate dielectric 132. Noise such as dark current may be generated due to such defects. As a remedy, the semiconductor region 103 is formed at the interface so as to remove charges (electrons) from the dark current. In the depicted embodiment, the semiconductor region 103 may be formed of a doped P-type region with a doping concentration greater than the doping concentration of the substrate 101.

The auxiliary transistor 140 is formed on the second surface 101B of the substrate 101. The auxiliary transistor 140 is disposed adjacent to the first photodiode 102. The auxiliary transistor 140 is introduced to enhance device performance during the shutter phase and the readout phase, operation details of which will be described in subsequent paragraphs. The auxiliary transistor 140 includes a gate electrode 140G, a gate dielectric 144 and a source/drain region 142. Charges may be drained to the source/drain region 142 during a shutter operation via control of the gate electrode 140G. The gate electrode 140G has a material and a configuration similar to those of the gate electrode 130G of the transfer transistor 130. The gate dielectric 144 has a material and a configuration similar to those used in the gate dielectric 132. In some embodiments, the source/drain region 142 has an N-type dopant.

The first photodiode 102 may be disposed closer to the second surface 101B than the second photodiode 104, thus the first photodiode 102 and the second photodiode 104 are sometimes termed as "shallow photodiode" (SPD) and "deep photodiode" (DPD), respectively. The first photodiode 102 and the second photodiode 104 may have different arrangements. The first layer 102P has an area less than an area of the second layer 102N wherein both areas are viewed from above. Although not illustrated, the second layer 102N may have a shape substantially following the pattern of the first layer 102P. In some embodiments, the first layer 102P and the second layer 102N extend below the gate electrode 140G of the auxiliary transistor 140 where the second layer 102N extends farther than the first layer 102P. The first layer 102P overlaps the gate electrode 140G by a width W1. In some embodiments, the width W1 is greater than about 10 nm. The first layer 102P overlaps the gate electrode 130G by a width W2. In some embodiments, the width W2 is greater than about 10 nm. The first layer 102P is distant from a sidewall of the vertical portion 130V by a width W3. In some embodiments, the width W3 is greater than about 20 nm. In some embodiments, the second layer 102N also extends below the horizontal portion 130H of the gate electrode 130G. The second layer 102N may contact a sidewall of the semiconductor region 103 adjacent to the vertical portion 130V.

The first layer 104P of the second photodiode 104 extends below the second layer 102N of the first photodiode 102. The first layer 104P is formed on the isolation structure 112. In some embodiments, the first layer 104P partially overlaps the second layer 104N. In some embodiments, the first layer 104P covers a portion of the isolation structure 112 for mitigating leakage current. In some embodiments, the first layer 104P contacts an upper surface of the isolation structure 112. In some embodiments, the first layer 102P is separated from the gate electrode 130G of the transfer transistor 130. A channel 101C formed of the substrate material 101 between the semiconductor region 103 and the first layer 104P of the second photodiode 104 is created for facilitating charge movements between the first photodiode 102 and the second photodiode 104. The blooming effect can be relieved due to the channel 101C.

The reset transistor 150, the amplifier transistor 160 and the select transistor 170, herein collectively referred to as a readout circuit 120, are formed on the second surface 101B of the substrate 101. The reset transistor 150 includes a gate electrode 150G, a gate dielectric 154, and two source/drain regions 156 and 158. The amplifier transistor 160 includes a gate electrode 160G, a gate dielectric 164, and two source/drain regions 166 and 168. In some embodiments, the amplifier transistor 160 is configured as a source follower. The readout transistor 170 includes a gate electrode 170G, a gate dielectric 174, and two source/drain regions 176 and 178, where one source/drain region 176 may be shared with the source/drain region 168 of the amplifier transistor 160. The gate electrodes 150G. 160G and 170G have materials and configurations similar to those used in the gate electrode 130 or 140. The gate dielectrics 154, 164 and 174 include materials and configurations similar to those used in the gate dielectric 132 or 144.

The reset transistor 150 is configured to preset the voltage at the floating diffusion region 126 to a predetermined voltage, e.g., a supply voltage, during a shutter operation. The accumulated charges in the floating diffusion region 126 will be drained through the reset transistor 150 accordingly. During a readout operation, the amplifier transistor 160 and the select transistor 170 are configured to provide an image data voltage at the source/drain region 178 of the readout transistor 170 in response to the potential at the floating diffusion region 126. In some embodiments, the floating diffusion region 126 is electrically coupled to the source region 156 of the reset transistor 150 and the gate electrode 160G of the amplifier transistor 160, through a conductive path 188, for performing shutter and data readout operations. In some embodiments, the conductive path 188 is a conductive trace or an interconnect layer including conductive materials and insulating materials. In some embodiments, the conductive path 188 is disposed in the substrate 101 or external to the substrate 101.

In some embodiments, the transistors of the readout circuit 120 are formed in a well region 114. In some embodiments, the well region rests on the first layer 104P of the second photodiode 104. In some embodiments, the well region 114 abuts the second layer 102N of the first photodiode 102. In the depicted embodiment, the well region 114 is formed of a P-type doped region, but it can also be an N-type doped region in alternative embodiments. In some embodiments, the well region 114 has a doping concentration greater than the doping concentration of the substrate 101. In some embodiments, the well region 114 has a doping concentration less than the doping concentration of the first layer 102P or 104P. Furthermore, a shallow trench isolation (STI) 116 is formed between the readout circuit 120 and the remaining features of the image sensor device 100. In some embodiments, the STI 116 is formed of a material similar to that of the isolation structure 112. In contrast to the isolation structure 112, the STI 116 is exposed through the second surface 101B of the substrate 101. In some embodiments, the STI 116 is formed in the well region 114.

Referring to FIG. 1B, geometries of the image sensor device 100 are shown from a plan view. The readout circuit 120 is disposed next to the first photodiode 102. The components of the readout circuit 120, such as the reset transistor 150, the amplifier transistor 160 and the select transistor 170 may be arranged in a row. In some embodiments, the first layer 102P of the first photodiode 102 has a rectangular shape, where one corner of the rectangle is replaced with the gate electrode 140G and another corner is replaced with the floating diffusion region 126. It is understood that other shapes, such as a circular shape or polygonal shape, for the first layer 102P are also possible. In the present embodiments, each of the floating diffusion region 126 and the gate electrode 140G has a triangular shape. Further, the floating diffusion region 126 and the gate electrode 140G are disposed at diagonally opposite corners of the first layer 102P. The source/drain region 142 of the auxiliary transistor 140 has a rectangular shape and is disposed adjacent to the rectangle of the first layer 102P. The electrode gate 140G of the auxiliary transistor 140 has a bevel side 140R facing the gate electrode 130G of the transfer transistor 130. In some embodiments, the area of the electrode gate 130G can be enlarged by making the bevel side 140R closer to the horizontal portion 130H of the electrode gate 130G without contact therebetween. In that situation, the first layer 102P is partially covered by the gate electrode 140G. In some embodiments, the electrode gate 140G covers the geometric center 102C of the first layer 102P. In an embodiment, the gate electrode 130G substantially covers the first layer 102P while leaving a distance from the horizontal portion 130H of the gate electrode 130G. Furthermore, the distances W1, W2, W3, D1 and D2 described with reference to FIG. 1A are also identified in FIG. 1B from a plan view.

Figure 1C:
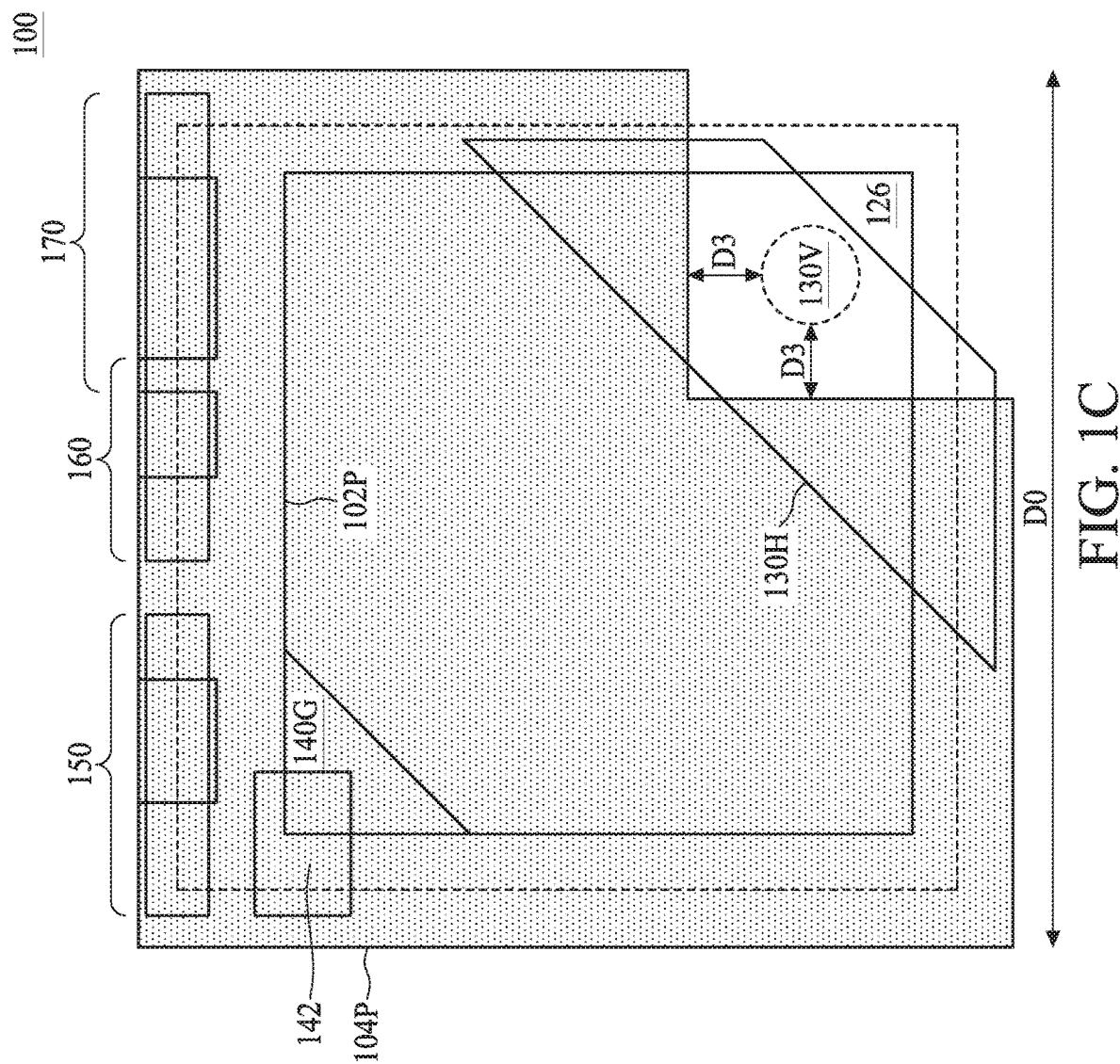
FIGS. 1C and 1D are schematic layouts of doped layers of the image sensor device in FIG. 1A, in accordance with some embodiments.
Figure 1D:
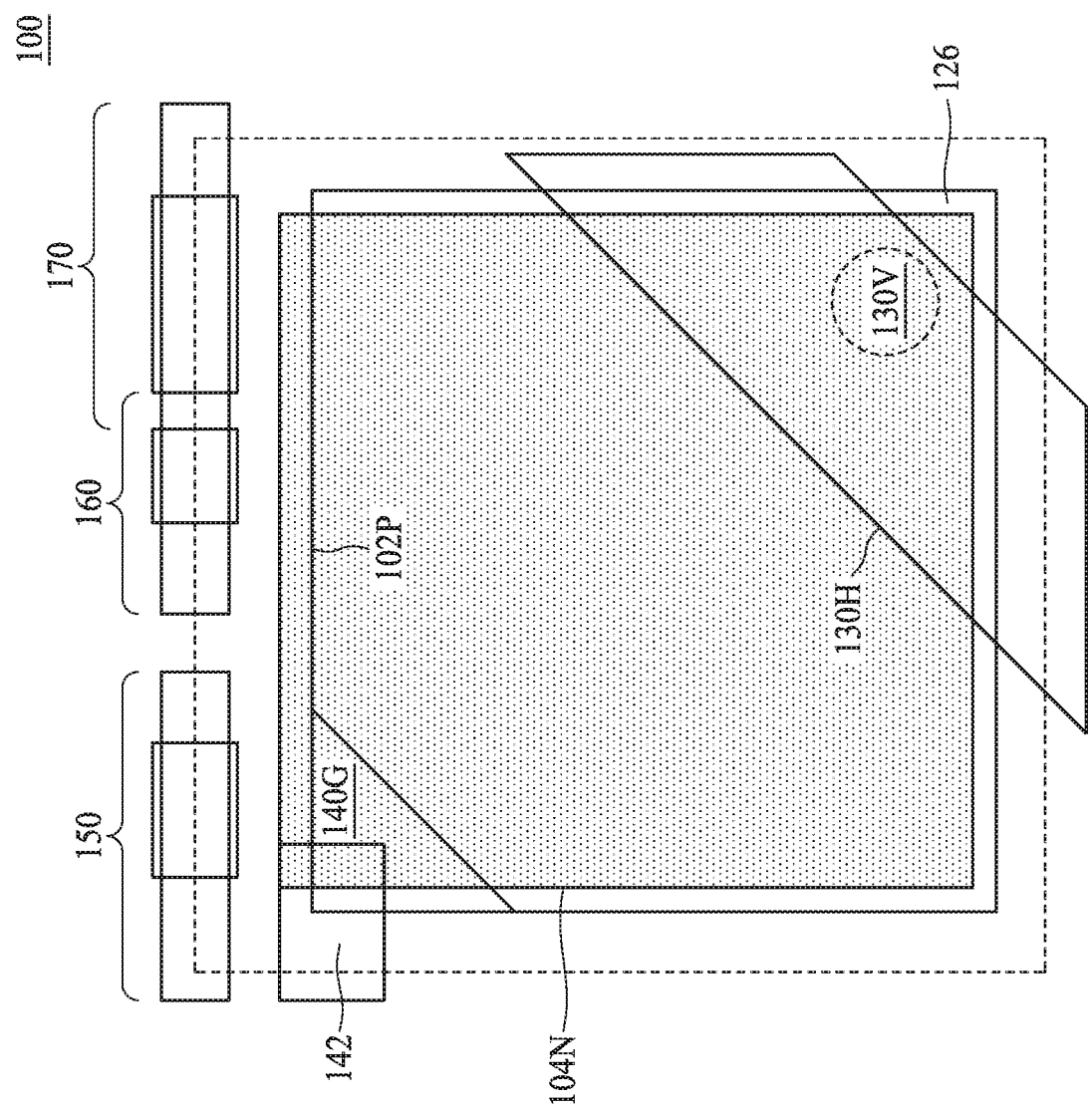

FIGS. 1C and 1D are schematic layouts of doped layers 104P and 104N of the image sensor device 100, in accordance with some embodiments. Referring to FIG. 1C, the first layer 104P of the second photodiode 104 has an area (depicted as the dotted region) greater than that of the first layer 102P of the first photodiode 102. In some embodiments, the first layer 104P overlaps the readout circuit 120, i.e., the transistors 150, 160 and 170. In some embodiments, the second layer 104P partially overlaps the horizontal portion 130H. In some embodiments, the second layer 104P is laterally separate from the vertical portion 130V by a distance D3. In some embodiments, a ratio D3/D0 is between about 0.05 and about 0.25, wherein the length D0 is a length of one side of the first layer 104P. In some embodiments, the distance D3 is between about 50 nm and about 250 nm. Referring to FIG. 1D, the second layer 104N (depicted as the dotted region) of the second photodiode 104 has a substantially rectangular shape. In some embodiments, the second layer 104N has an area less than an area of the first layer 104P. Another difference between the second layer 104N and the first layer 104P is that the second layer 104N extends below the vertical portion 130V of the electrode gate 130G, as can also be seen in FIG. 1A.

Figure 2:
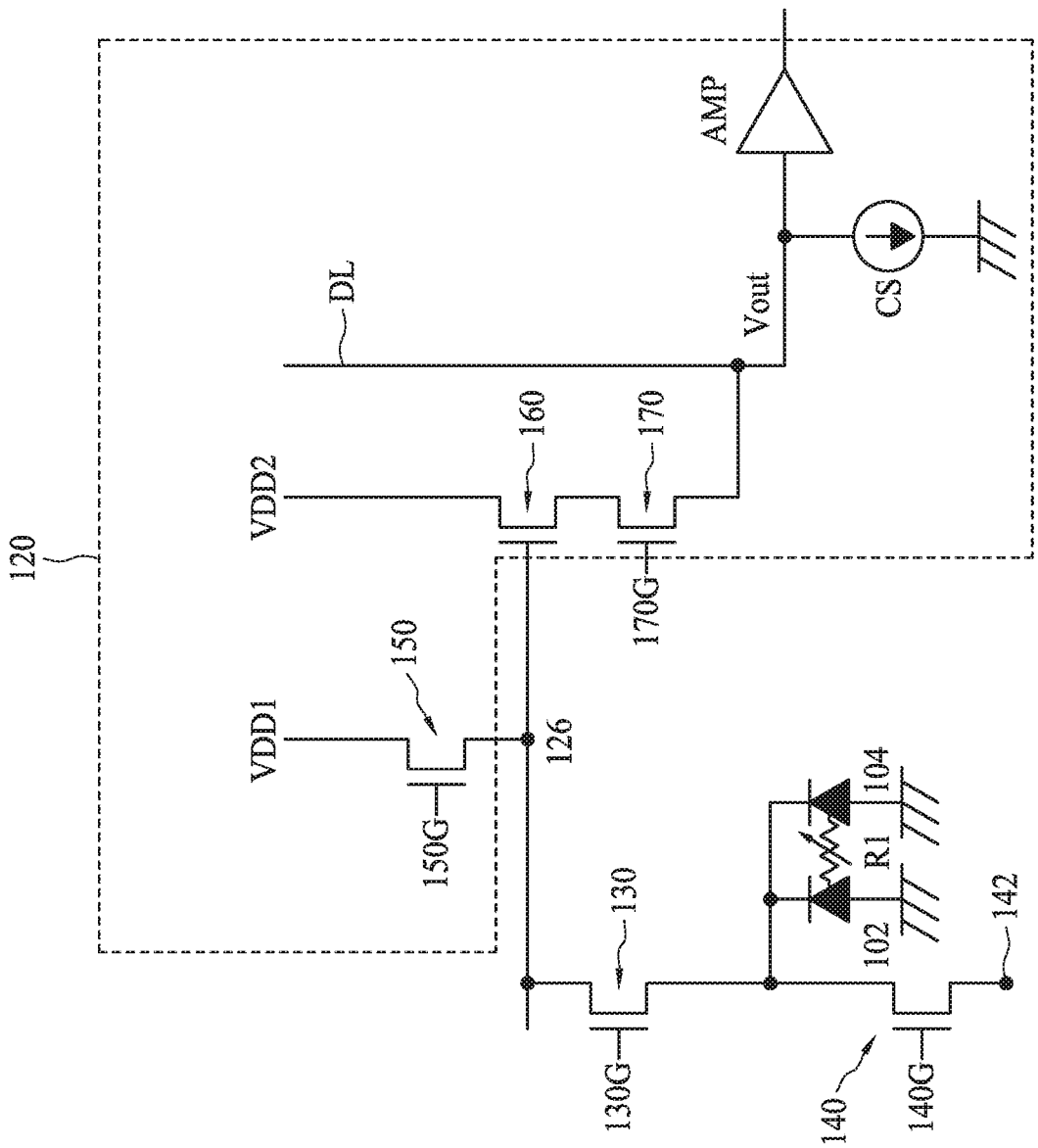
FIG. 2 is a schematic circuit diagram of an image sensor device, in accordance with some embodiments.

FIG. 2 is a schematic circuit diagram of the image sensor device 100 in FIG. 1A, in accordance with some embodiments. Both of the first photodiode 102 and the second photodiode 104 are coupled to the transfer transistor 130 and the auxiliary transistor 140. In some embodiments, the first photodiode 102 and the second photodiode 104 are illustrated in FIG. 2 as connected in parallel. Although it is shown in FIG. 1A that the first photodiode 102 and the second photodiode 104 are cascaded in a stack, in operation of electron transfer, the generated charges in each of the first photodiode 102 and the second photodiode 104 can be individually transferred to the floating diffusion region 126 in parallel. The image sensor device 100 further includes a variable resistance R1 between the first photodiode 102 and the second photodiode 104. The variable resistance R1 represents a path of charge transfer between the photodiodes 102 and 104 after electrons generated from one photodiode may be directed to the other photodiode before they are transferred to the floating diffusion region 126. The variable resistance resulting from the varying current may be dependent upon the amounts of photo-generated charges in a single data sampling operation. Operation details associated with charge transfer between the two photodiodes 102 and 104 will be provided in subsequent paragraphs.

The floating diffusion region 126 is coupled to a source/drain region (e.g., region 156 in FIG. 1A) of the reset transistor 150 and the gate electrode 160G of the amplifier transistor 160. The gate electrode 150G is coupled to a reset signal in a reset operation. Another source/drain region (e.g., region 158 in FIG. 1A) of the reset transistor 150 is electrically coupled to a supply voltage VDD1. A source/drain region (e.g., region 166 in FIG. 1A) of the amplifier transistor 160 is electrically coupled to a supply voltage VDD2, and another source/drain region (e.g., region 168 in FIG. 1A) of the amplifier transistor 160 is electrically coupled to the source/drain region (e.g. region 176) of the select transistor 170. The gate electrode 170G of the select transistor 170 is coupled to a row select signal in a reset operation. A conversion voltage Vout at another source/drain region (e.g., region 178) is fed to an output data line DL. In some embodiments, the converted voltage Vout is provided to an amplifier circuit AMP for further signal processing. In some embodiments, the select transistor 170 is coupled to a current source device CS through the data line DL to facilitate voltage sampling in the readout operation.

Figure 3A:
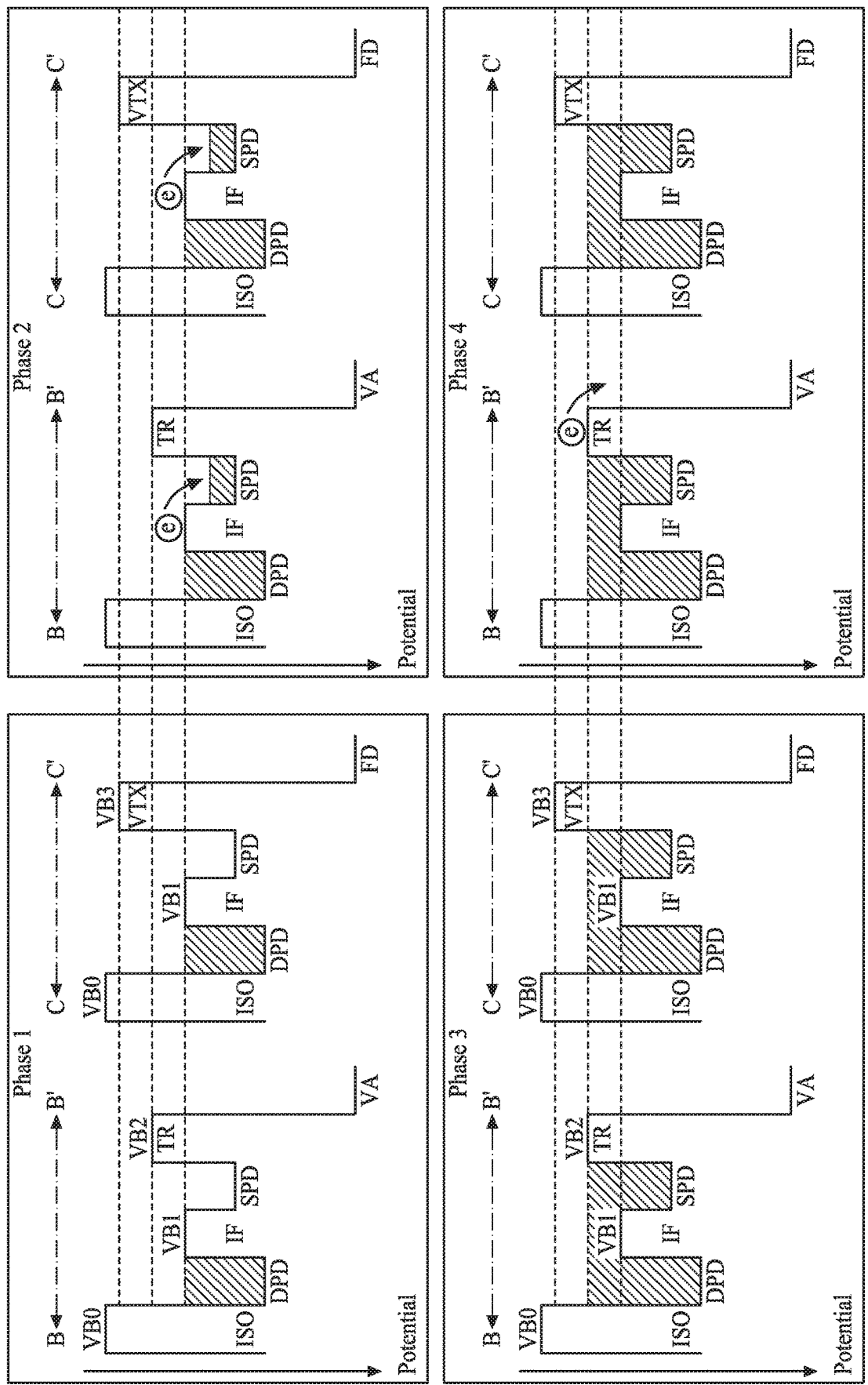
FIGS. 3A and 3B are schematic diagrams of potential profiles associated with the image sensor device of FIG. 1A, in accordance with some embodiments.

FIG. 3A is a schematic diagram of potential profiles associated with the image sensor device of FIG. 1A during a charge integration period, in accordance with some embodiments. The potential profiles are drawn along sectional lines BB' and CC' in FIG. 1A. Four phases of charge accumulation (integration) are shown in FIG. 3A where the y-axis represents a potential (voltage) value, in which the arrow of the y-axis points downward to illustrate the potential of accumulated electrons more clearly. The sectional line BB' in FIG. 1A transverses the isolation structure 112 (ISO), the second photodiode 104 (DPD) and first photodiode 102 (SPD), the gate electrode 140G (TR) of the auxiliary transistor 140 and the source/drain region 142 (VA). Similarly, the sectional line CC' in FIG. 1A transverses the isolation structure 112 (ISO), the second photodiode 104 (DPD) and first photodiode 102 (SPD), the gate electrode 130G (VTX) of the transfer transistor 130 and the floating diffusion region 126 (FD). Through proper arrangements of the above-mentioned nodes, a potential profile suitable for charge integration can be established. For example, the isolation structure 112 (ISO) and the gate electrodes 130G (VTX) and 140G (TR) may be biased at voltages VB0, VB2 and VB3, respectively. In some embodiments, the first photodiode 102 (SPD) and the second photodiode 104 (DPD) are fabricated with different doping concentrations so as to provide an interface (IF) with a barrier voltage VB1 between the first photodiode 102 (SPD) and the second photodiode 104 (DPD). In addition, the floating diffusion region 126 (FD) and source/drain 142 (VA) are biased at relatively high voltages. The barrier voltages VB1, VB2 and VB3 collaboratively construct a charge tank in the first photodiode 104

(SPD) to keep the generated electrons from flowing to adjacent pixels. Similarly, the barrier voltages VB0 and VB1 collaboratively construct another charge tank in the second photodiode 104 (DPD) to retain the generated electrons. In some embodiments, the barrier voltage VB0 is less than the barrier voltage VB3. In some embodiments, the potential of the second photodiode 104 (DPD) is higher than the potential of the first photodiode 102 (SPD). In some embodiments, the barrier voltages follow a relationship of VB0<VB3<VB2<VB1.

Still referring to FIG. 3A, assume for the sake of discussion that electrons are generated by the second photodiode 104 (DPD). Referring to the subplot of Phase 1, electrodes are accumulated in the second photodiode 104 (DPD) at a beginning stage of charge integration. At Phase 2, when the accumulated electrons reach a potential less than barrier voltage VB1, excess electrons start to flow to the first photodiode 102 (SPD). That is because electrons have a negative polarity; thus more accumulated charges results in a higher electron potential with less potential value. Subsequently, the second photodiode 104 (DPD) continues to receive radiation in Phase 3. The electrons reach a potential that becomes lower than the voltage VB1 of the interface barrier IF yet is still equal to or higher than the barrier voltages VB0, VB2 and VB3. As a result, substantially no free electrons flow out of the first photodiode 102 (SPD) or the second photodiode 104 (DPD). During Phase 4 when the electrons reach an accumulated potential lower than the barrier voltage VB2 of the auxiliary transistor 140 (TR) and higher than the barrier voltage VB3 of the transfer transistor 130, electrons overflow to the source/drain region 142 (VA). In that case, the electrons have reached the well capacity since additional electrons cannot be accommodated in either the first photodiode 102 (SPD) or the second photodiode 104 (DPD). Since the barrier voltage VB3 is lower than the barrier voltage VB2, overflow electrons are drained away through the source/drain region 142 rather than transferred into the floating diffusion region 126 during the course of charge integration. In addition, the overflow charges are prevented from entering adjacent unit pixels because they are directed to the source/drain region 142 (VA) instead. The blooming effect can be reduced accordingly. Referring to FIGS. 2 and 3A, the flow of electrons from the second photodiode 104 to the first photodiode 102 is represented by the variable resistance R1. The flow of electrons through the variable resistance R1 from the first photodiode 102 to the second photodiode 104 is described with reference to FIG. 3B, as provided below.

Figure 3B:
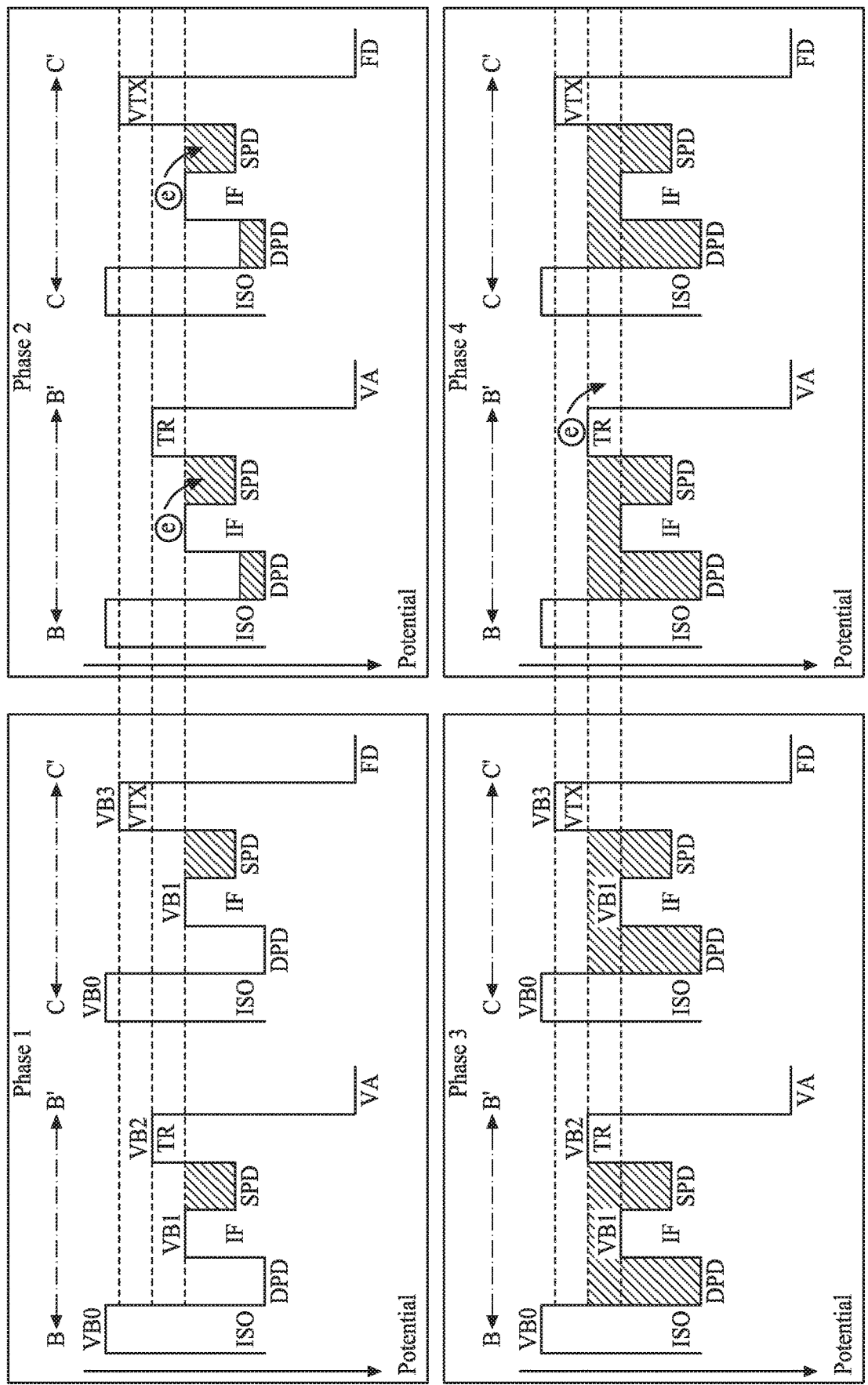

FIG. 3B is a schematic diagram of potential profiles associated with the image sensor device of FIG. 1A during a charge integration period, in accordance with some embodiments. In contrast to FIG. 3A, it is assumed in FIG. 3B that the charges are generated mainly by the first photodiode 102 (SPD). The process of charge integration and accumulation in the first photodiode 102 (SPD) and the second photodiode 104 (DPD) shown in FIG. 3B is similar to that in FIG. 3A except that the electrons first reach the well capacity of first photodiode 102 (SPD), followed by an electron flow from the first photodiode 102 (SPD) toward the second photodiode 104 (DPD).

Figure 4A:
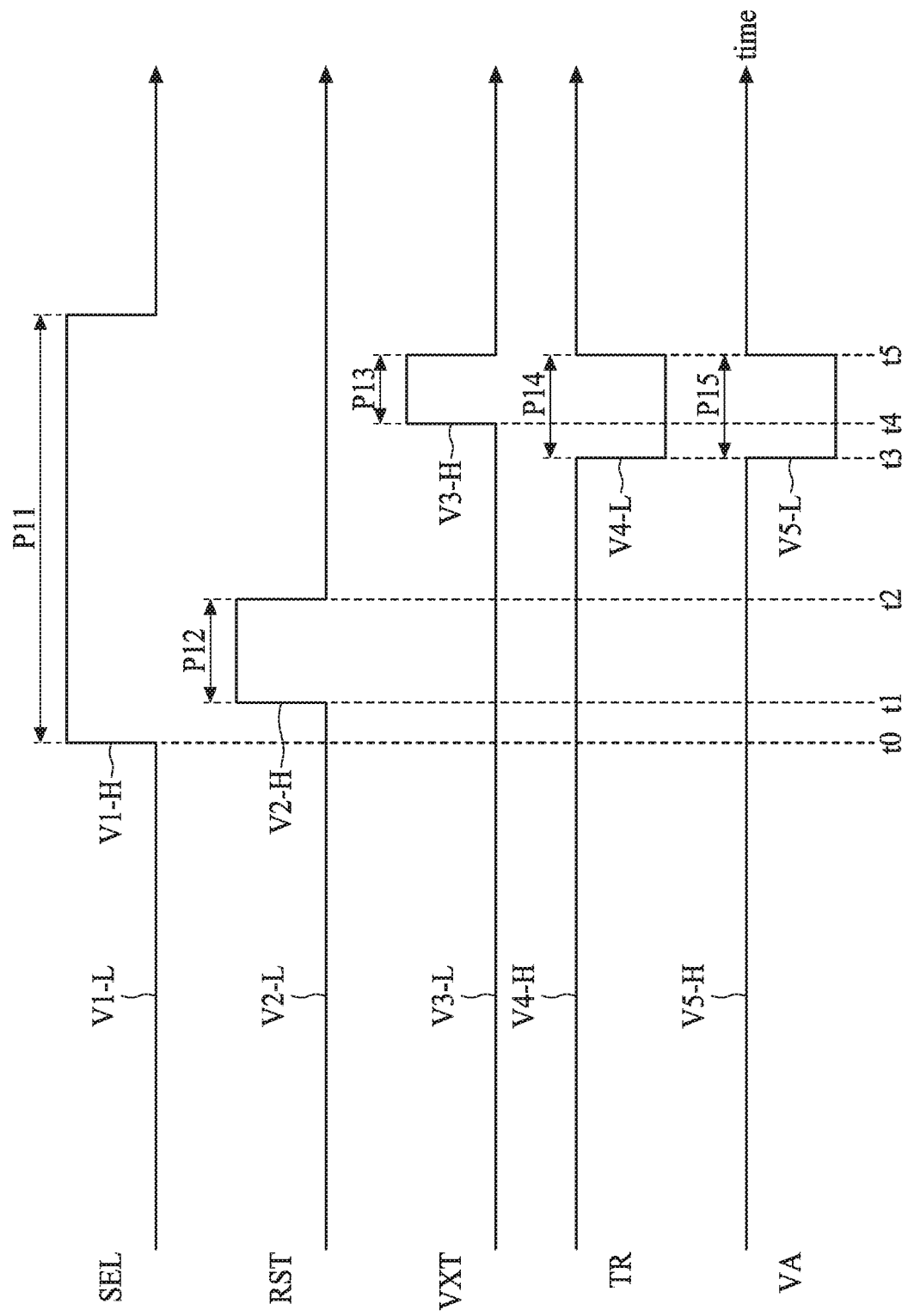
FIG. 4A is a timing diagram of a readout operation of an image sensor device, in accordance with some embodiments.

FIG. 4A is a timing diagram of a readout operation of the image sensor device in FIG. 1A, in accordance with some embodiments. The voltage settings for the relevant nodes are shown in Table I.

TABLE I

Voltage setting for operating an image sensor device

| Node | Status | Value |
| --- | --- | --- |
| Select transistor | V 1-H | Supply voltage (e.g., 2.8 V) |
| 170 (SEL) | V 1-L | Ground voltage (e.g., −1.0 V-0 V) |
| Reset transistor | V 2-H | Supply voltage (e.g., 2.8 V) |
| 150 (RST) | V 2-L | Ground voltage (e.g., −1.0 V-0 V) |
| Transfer transistor | V 3-H | Supply voltage (e.g., 2.8 V) |
| 130 (VTX) | V 3-L | −2.0 V < V 3-L < 0 V(e.g., −1.2 V) |
| Auxiliary transistor | V 4-H | −1.2 V < (V 4-H) < 0 V (e.g., −0.5 V) |
| 140 (TR) | V 4-L | −2.0 V < V 4-L < 0 V (e.g., −1.2 V), V 4-L < V 4-H |
| Source/drain | V 5-H | Supply voltage (e.g., 2.8 V) |
| region 142 (VA) | V 5-L | 0.5 V < V 5-L < V 5-H, (e.g., 1.0 V) |

Before the start of the readout operation, the select transistor 170 (SEL), reset transistor 150 (RST) and the transfer transistor 130 (VTX) are turned off through biasing voltages V1-L, V2-L and V3-L, respectively. During operation, the select transistor 170 (SEL) is turned on by a pulse starting at time instant t0 through a biasing voltage V1-H until the end of a readout period P11. When the reset transistor 150 (RST) receives a reset voltage V2-H at time instant t1, the reset transistor 150 (RST) is turned on, causing the floating diffusion region 126 (FD) to reset, thereby draining electrons away and setting the potential of the doping region 126 to a predetermined voltage, such as the supply voltage. The reset is performed for a period P12 until time instant t2. When the transfer transistor 130 (VTX) receives an enable voltage V3-H at time instant t4, charges are transferred to the floating diffusion region 126 by an electric field generated by the gate electrode 130G. The charge transfer is performed for a pulse period P13 until time instant t5. When the transfer transistor 130 (VTX) returns to an "off" state at time instant t5, charge transfer is terminated. In some embodiments, the pulse period for the reset transistor 150 (RST) is between about 200 μs and about 2000 μs. In some embodiments, the pulse period for the transfer transistor 130 (VTX) is between about 200 μs and about 2000 μs.

The auxiliary transistor 140 (TR) is employed to generate an additional electric field that magnifies the electric field contributed by the transfer transistor 130 (VTX). Moreover, the pulse for enabling the auxiliary transistor 140 may be substantially synchronous with the pulse for enabling the transfer transistor 130 (VTX). Initially, the auxiliary transistor 140 (TR) is disabled and set at the voltage V4-L. At time instant t3, the auxiliary transistor 140 (TR) is turned on through a pulse with period P14 that biases the electrode gate 140G at a voltage of V4-H. The auxiliary transistor 140 (TR) may be turned off at time instant t5. In some embodiments, time instant t3 is aligned with time instant t4. In some embodiments, time instant t3 is ahead of time instant t4 by a length of, for example, between about 50 ns and 500 ns. In some embodiments, the auxiliary transistor 140 (TR) is turned off at a time behind time instant t5 by a length of, for example, between about 20 ns and 200 ns.

In some embodiments, the source/drain region 142 (VA) is biased with a pulse, with voltage V5-L and period P15, substantially synchronous with the pulse for the auxiliary transistor 140 (TR). The pulse for biasing the source/drain region 142 (VA) further generates an additional electric field that magnifies the electric field generated by the transfer transistor 130 (VTX) and the auxiliary transistor 140 (TR). In some embodiments, the pulse period P15 is substantially equal to the pulse period P14. In some embodiments, the start time of period P15 is ahead of time instant t3 by a length of, for example, between about 50 ns and 500 ns. In some embodiments, the end time of period P15 is behind time instant t5 by a length of, for example, between about 20 ns and 200 ns. Since the source/drain region 142 (VA) is biased at the supply voltage when it is deactivated, a coupled capacitive effect may occur between the gate electrode 140G and the source/drain region 142. The capacitive effect is reduced through biasing the drain/source region 142 (VA) at the voltage V5-L.

Figure 4B:
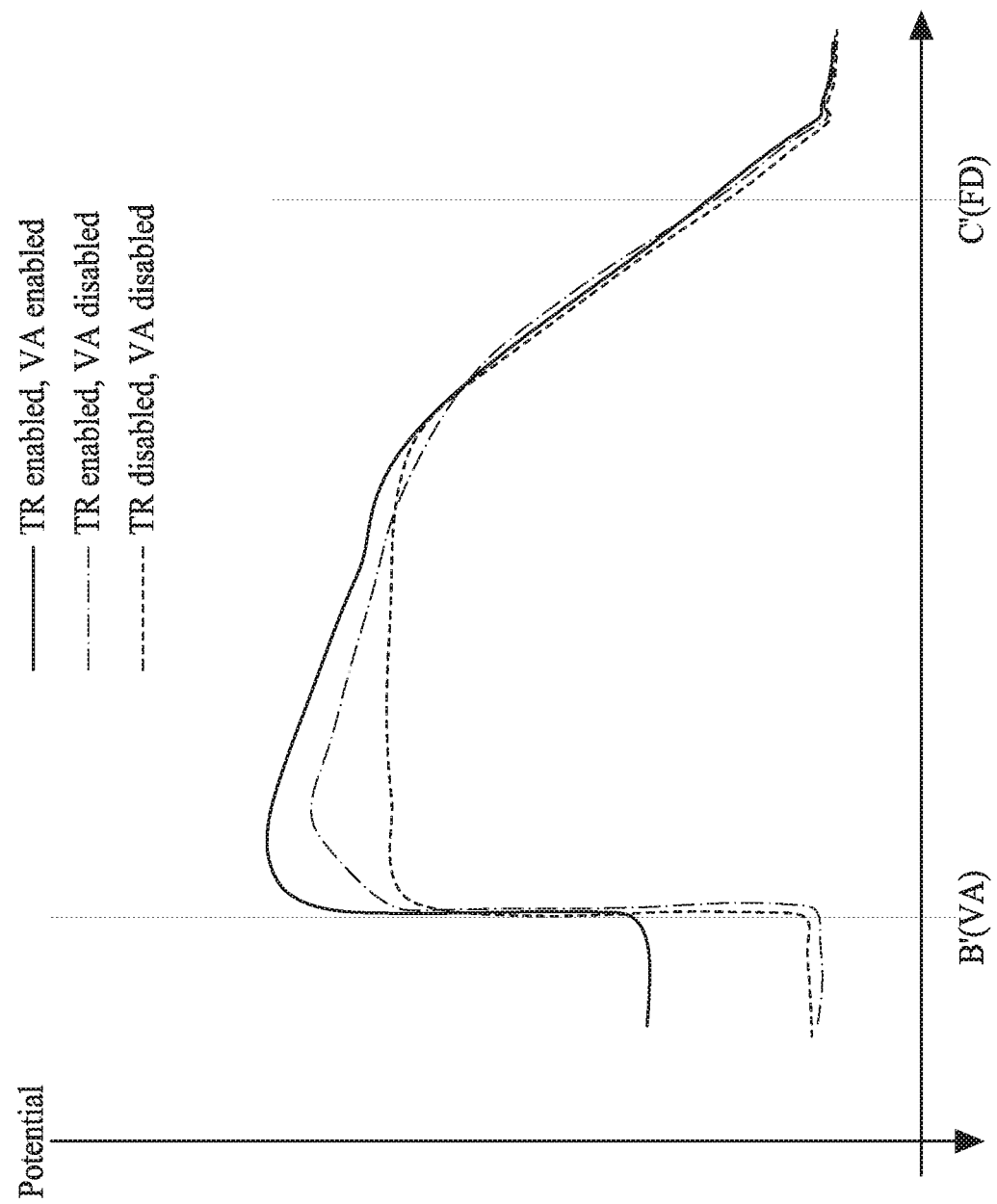
FIG. 4B is a schematic potential diagram associated with the readout operation in FIG. 4A, in accordance with some embodiments.

FIG. 4B is a schematic potential profile associated with the readout operation in FIG. 4A, in accordance with some embodiments. The potential profile is plotted along a straight sectional line running through the regions 142 and 126 and connecting points B' and C' in FIG. 1A. The dotted line, dashed line and solid line illustrated in FIG. 4B respectively represent the potential variation under the influence of the auxiliary transistor 140 and the source/drain region 142. The application of an additional negative potential, e.g., −1.2V, exerted through the electrode gate 140G, magnifies the potential gradient between the ends B' (electrode gate 140G) and C' (floating diffusion region 126). Further, the application of another potential, e.g., 1.0V, exerted through the source/drain region 142, can aid in increasing the electric field gradient for charge transfer. The readout speed of image data can be thus increased thereby reducing the image lag effect.

Figure 4D:
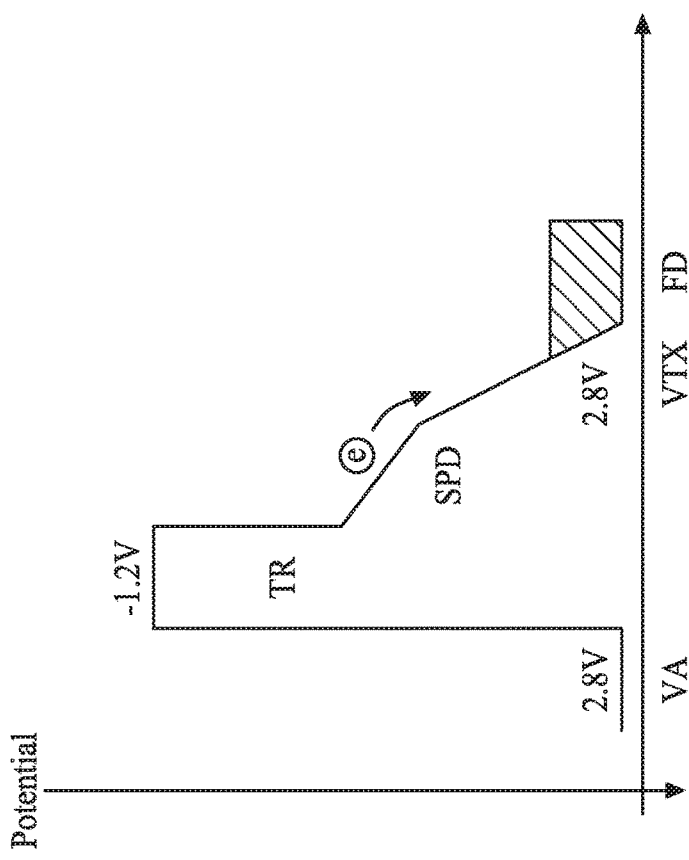
Figure 4C:
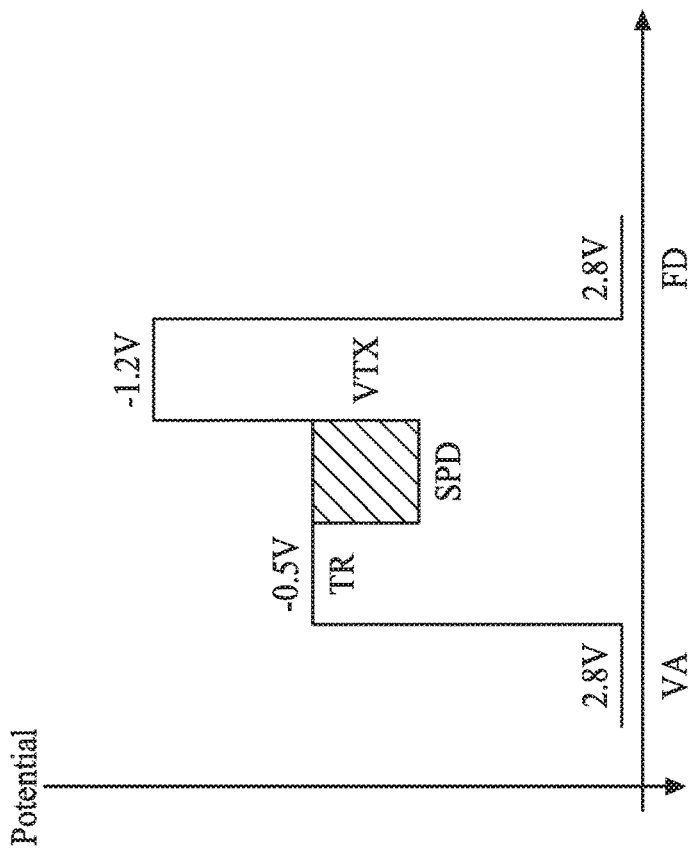

FIGS. 4C and 4D are schematic potential diagrams of the first photodiode 102 associated with the readout operation in FIG. 4A, in accordance with some embodiments. Similar labels for each node used in FIG. 3A, such as VA, TR, SPD. VTX, etc., are reused in denoting same features. Exemplary biased values for the nodes are illustrated beside the respective node. Referring to FIG. 4C, a potential profile around the first photodiode 102 (SPD) before data readout is performed (corresponding to any time prior to time instant t4). The charges are retained in the first photodiode 102 (SPD) without overflowing out. Subsequently, at time instant t4, through appropriate bias configuration (exemplified in Table I and FIG. 4B), an enhanced electric gradient between the auxiliary transistor 140 (TR) and the floating diffusion region 126 (FD) is generated, thereby facilitating charge transfer from the first photodiode 102 (SPD) to the floating diffusion region 126 (FD).

FIGS. 4E and 4F are schematic potential diagrams of the second photodiode 104 associated with the readout operation in FIG. 4A, in accordance with some embodiments. Referring to FIG. 4E, a potential profile around the second photodiode 104 (DPD) before data readout is performed (corresponding to any time prior to time instant t4). At time instant t4, through appropriate bias configuration (exemplified in Table I and FIG. 4B), the electric field between the auxiliary transistor 140 (TR) and the floating diffusion region 126 (FD) generated for the first photodiode 102 (SPD) can also be utilized for the second photodiode 104 (DPD), thereby facilitating charge transfer from the second photodiode 104 (DPD) to the floating diffusion region 126 (FD).

Figure 5A:
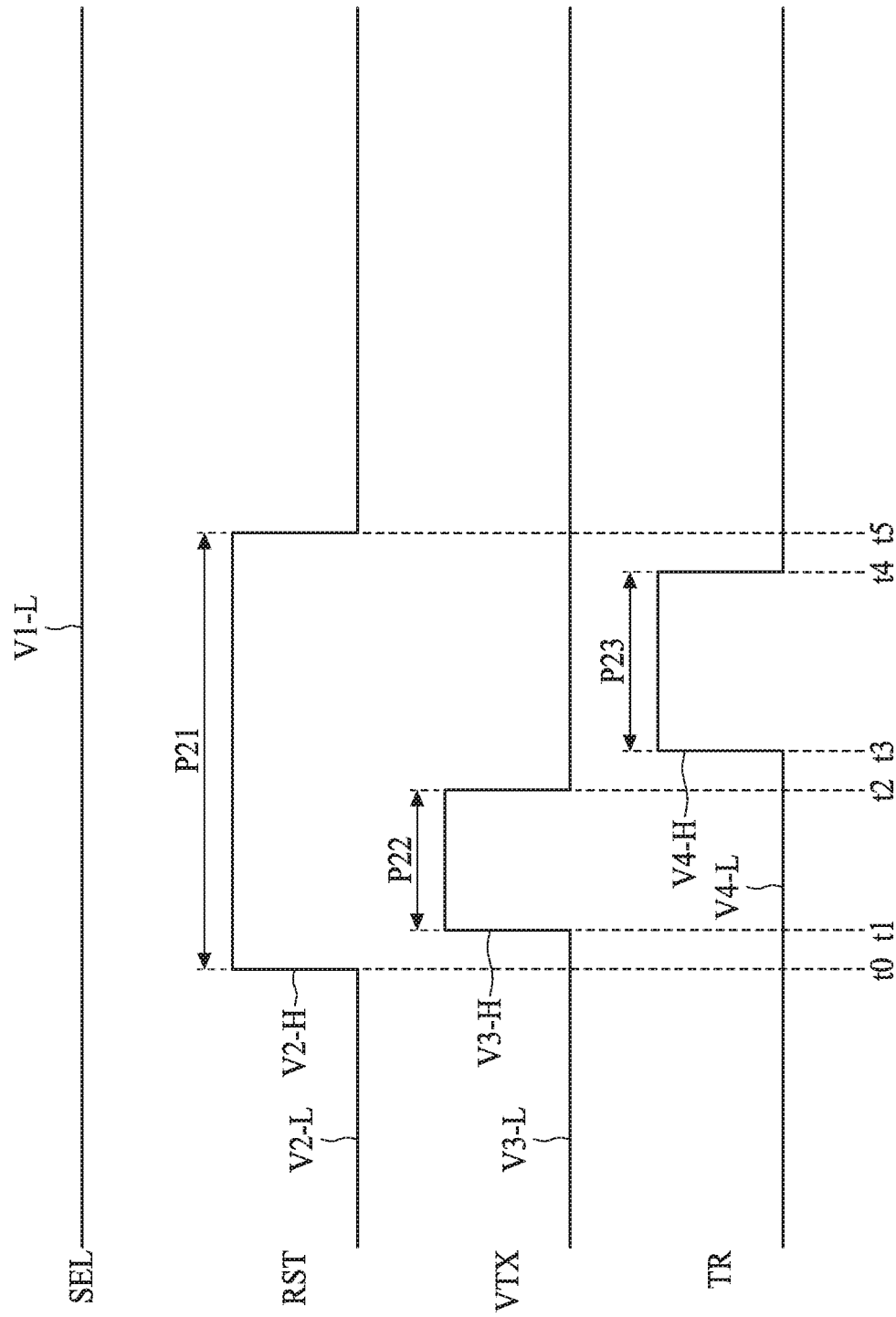
FIG. 5A is a timing diagram of a shutter operation of an image sensor device, in accordance with some embodiments.

FIG. 5A is a timing diagram of a shutter operation of an image sensor device, in accordance with some embodiments. The voltage settings for the nodes are shown in Table I. The select transistor 170 (SEL) and the source/drain region 142 (VR) are kept as V1-L and V5-H, respectively, to remain in an "off" state in the shutter operation. During operation, when the reset transistor 150 (RST) receives a reset voltage V2-1H at time instant t0, the reset transistor 150 (RST) is turned on for a pulse period P21 until time instant t5. When the transfer transistor 130 (VTX) receives a pulse with a voltage V3-H at time instant t1, electrons are drained away through the reset transistor 150 (RST) by an electric field generated by the gate electrode 130G. The charge reset is performed for a pulse with a period P22 until time instant t2. In some embodiments, the pulse period P22 for the transfer transistor 130 (VTX) is between about 200 µs and about 2000 µs.

The auxiliary transistor 140 (TR) is configured to generate an additional electric field that aids in resetting the charges in the photodiodes 102 and 104. Moreover, the biasing pulse for the auxiliary transistor 140 is offset from the biasing pulse for the transfer transistor 130 (VTX). Initially, the auxiliary transistor 140 (TR) is disabled and set at the voltage V4-L. At time instant t3, the auxiliary transistor 140 (TR) is turned on through a pulse with a period P23 and voltage V4-H. The auxiliary transistor 140 (TR) may be turned off at time instant t4 prior to the time instant t5. In some embodiments, time instant t3 is behind time instant t2 by a length of, for example, between about 20 ns and 200 ns. In some embodiments, time instant t4 is ahead of time instant t5 by a length of, for example, between about 20 ns and 200 ns. In some embodiments, the pulses with periods P22 and P23 are arranged in a substantially synchronous manner. In some embodiments, the occurrences of two pulses can be interchanged, i.e., the pulse with period P23 for enabling the auxiliary transistor 140 (TR) can be disposed prior to the pulse with period P22 for enabling the transfer transistor 130 (VTX). In some embodiments, the pulses P22 and P23 are not overlapped with each other.

FIGS. 5B, 5C and 5D are schematic potential diagrams of the photodiodes 102 and 104 associated with the shutter operation in FIG. 5A, in accordance with some embodiments. Similar labels for nodes in FIG. 4A, such as VA, TR, SPD, DPD, and VTX, are reused for denoting same features. Label RSTD represents a bias voltage, e.g., a supply voltage level, applied to the source/drain region 158 of the reset transistor 150 (RST). Referring to FIG. 5B, a potential profile for the first photodiode 102 (SPD), the second photodiode 104 (DPD) and neighboring nodes thereof prior to the shutter operation is shown. In cases where charges generated in a previous image data sampling are not read out completely, some residual charges may be left in the first photodiode 102 (SPD), the second photodiode 104 (DPD) or the floating diffusion region 126 (FD). Image data detection accuracy is thus deteriorated. As illustrated in FIG. 5C, at time instant t1 of FIG. 5A, through appropriate bias configuration (exemplified in Table I and FIG. 5A), a first electric field is generated through the transfer transistor 130 (VTX) that drains all residual charges in the second photodiode 104 (DPD) and the floating diffusion region 126 (FD), and at least a portion of the residual charges in the first photodiode 102 (SPD). Subsequently, at time instant t3, a second electric field is generated by the auxiliary transistor 140 (TR) and assists in removing any charges that are not drained by the first electric field. The first electric field and the second electric field are generated to drain charges along substantially opposite directions toward the transfer transistor 130 and the auxiliary transistor 140, respectively. Residual charges, especially those left in the first photodiode 102 (SPD), can be cleaned by help of the two electric fields.

Figure 6A:
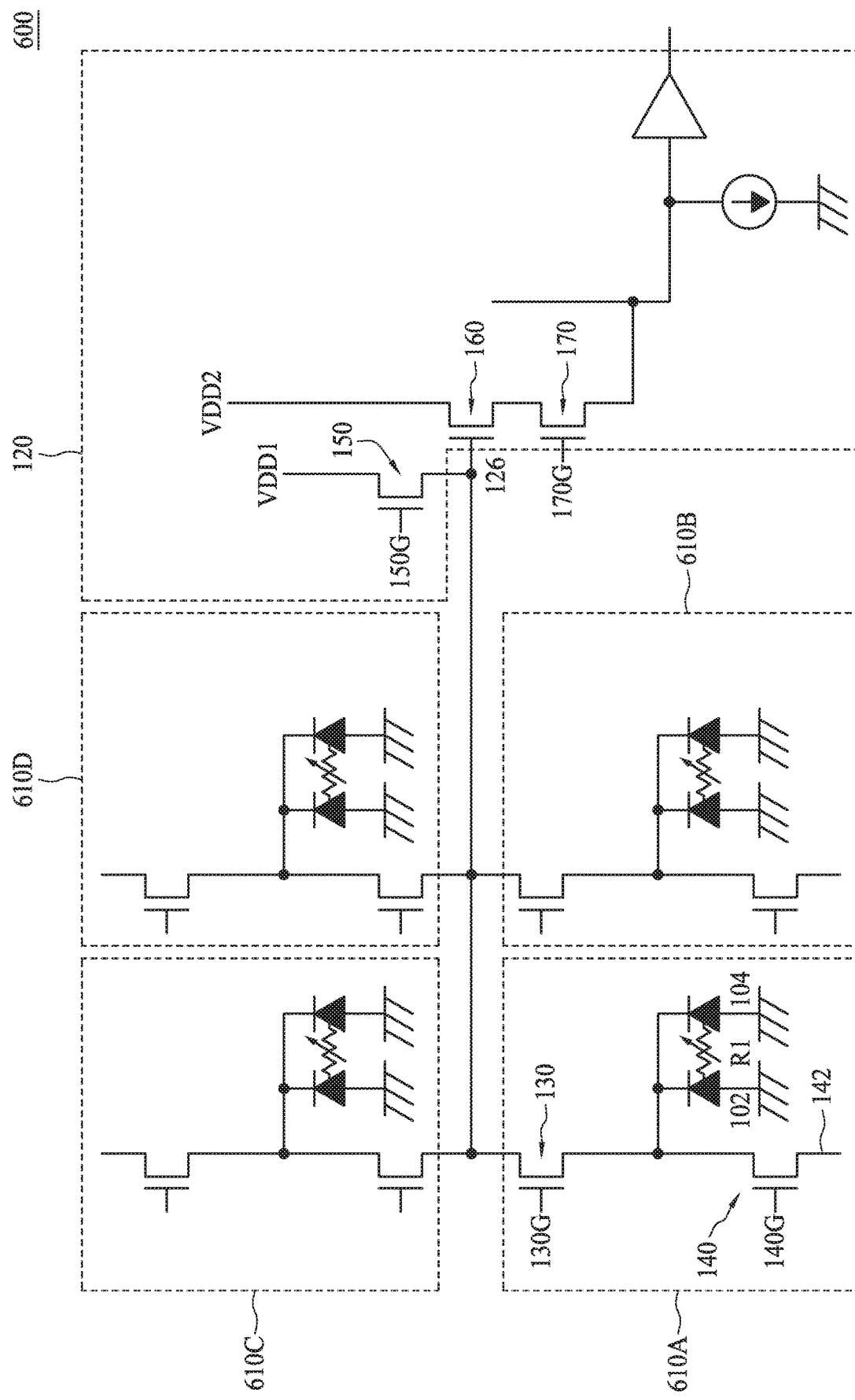
FIGS. 6A and 6B are a schematic circuit diagram and a plan view, respectively, of an image sensor device, in accordance with some embodiments.
Figure 6B:
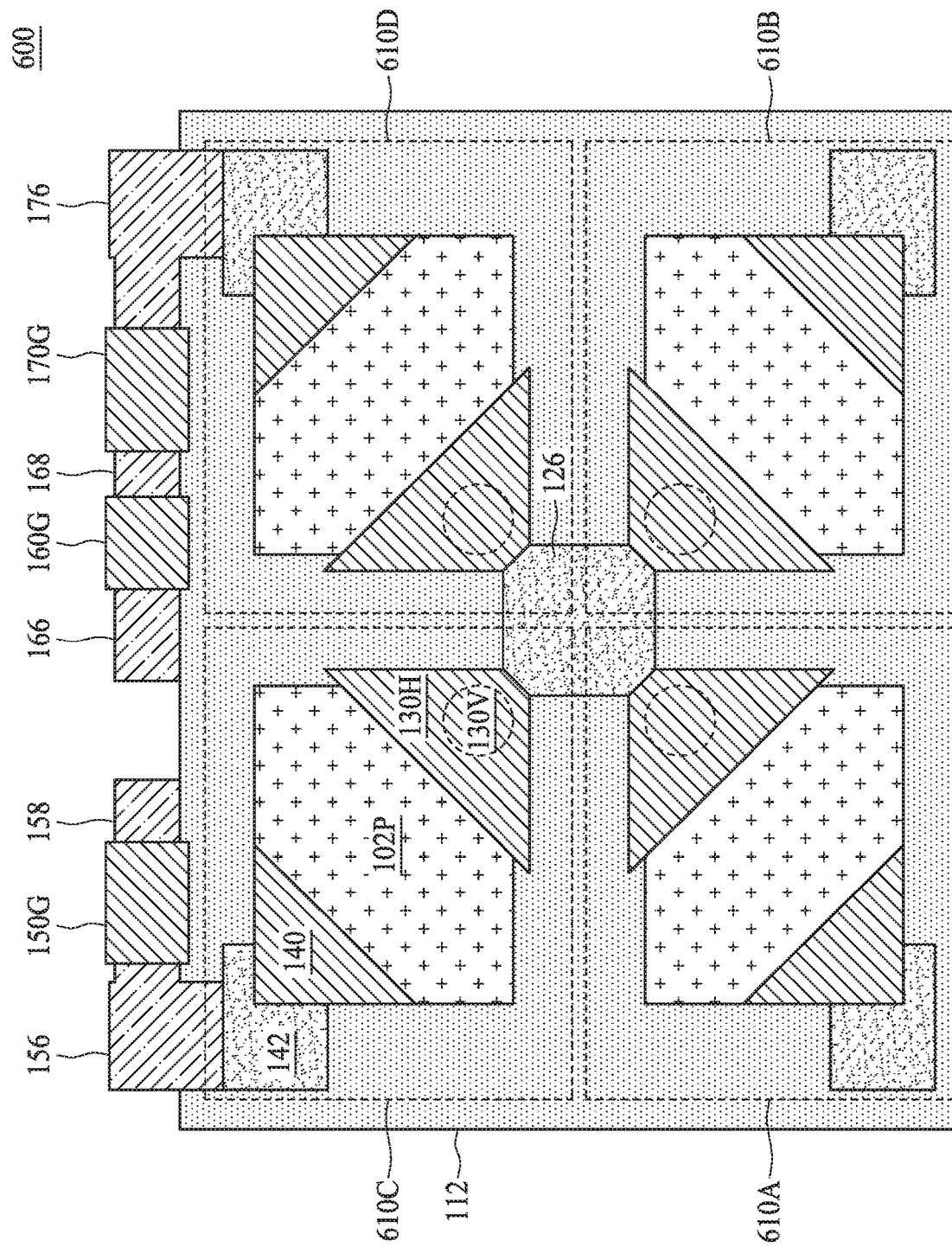

FIGS. 6A and 6B are a schematic circuit diagram and a plan view, respectively, of an image sensor device 600, in accordance with some embodiments. Referring to FIG. 6A, the image sensor device 600 includes a pixel array arranged in rows and columns where four exemplary unit pixels 610A through 610D are illustrated. Each of the four unit pixels has a transfer transistor 130, first photodiode 102, second photodiode 104 and auxiliary transistor 140 along with the source/drain region 142. In the depicted embodiment, the four unit pixels share one floating diffusion region 126. The readout circuit 120 is electrically coupled to the pixel array through the floating diffusion region 126. Referring to FIGS. 1B and 6B, the floating diffusion region 126 is disposed at a center of the array formed by the four unit pixels 610A through 610D. In some embodiments, the floating diffusion region 126 has a polygonal shape, such as an octagonal shape, a rectangular shape or a square shape. Moreover, the isolation structure 112 separates the unit pixels by filling spaces among the four unit pixels 610A through 610D.

Figure 6C:
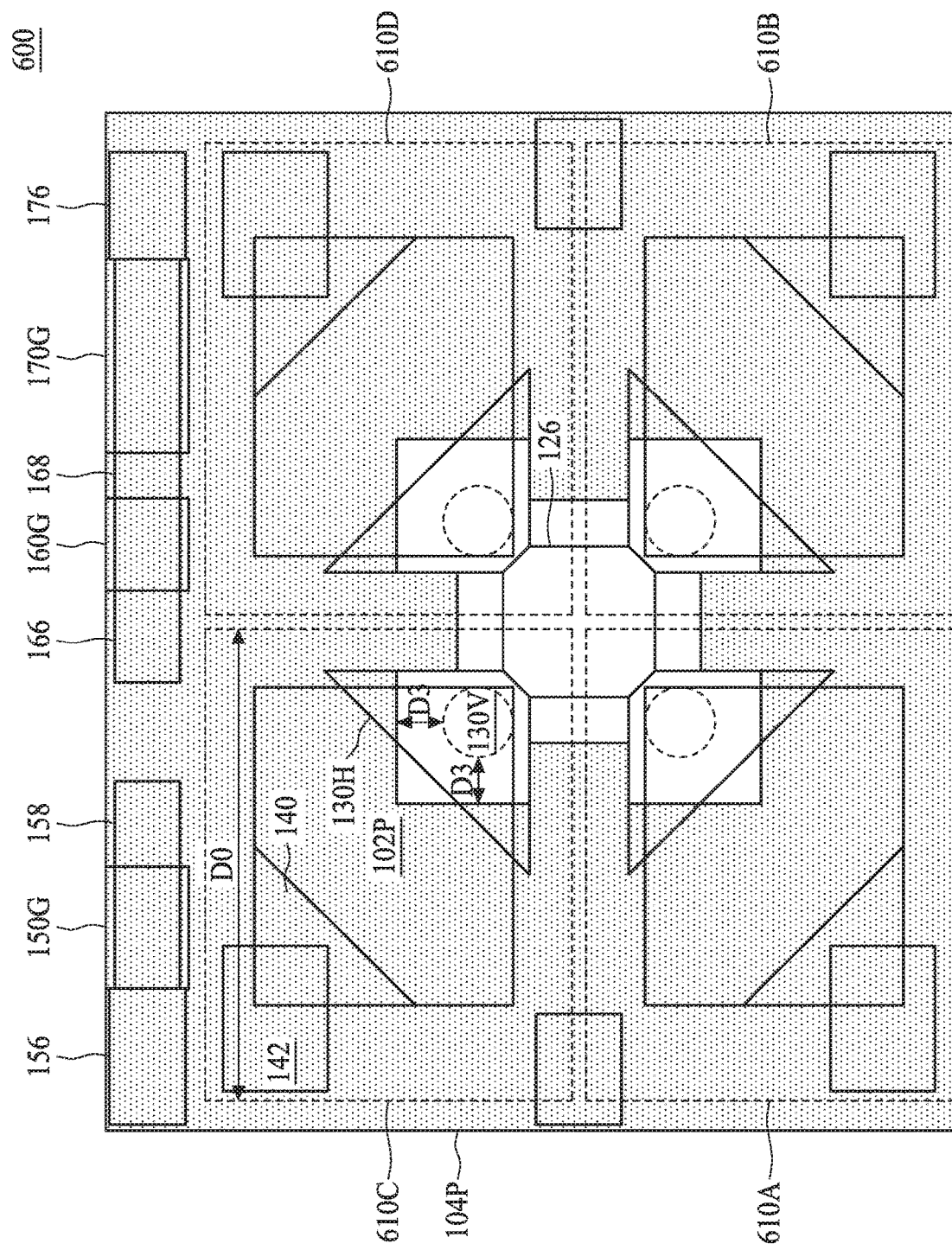
FIGS. 6C and 6D are schematic layouts of doped layers of the image sensor device in FIG. 6A, in accordance with some embodiments.
Figure 6D:
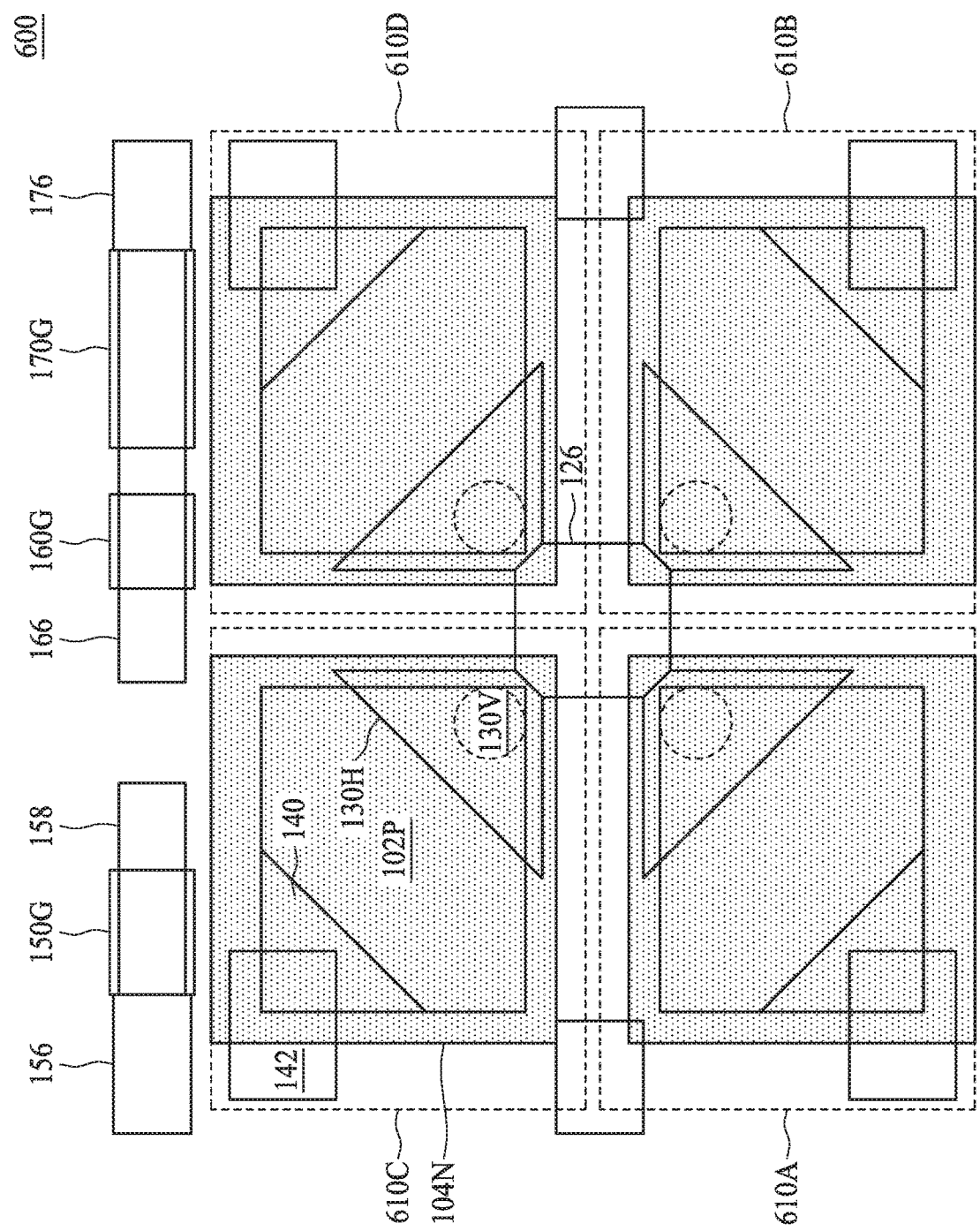

FIGS. 6C and 6D are schematic layouts of doped layers 104P and 104N of the second photodiode 104 in the image sensor device 600, in accordance with some embodiments. Referring to FIGS. 1C and 6C, the first layers 104P of adjacent unit pixels are connected to each other, and are depicted as the whole dotted region in FIG. 6C. In some embodiments, the first layer 104P is separate from the vertical portion 130V by a distance D3 in a configuration similar to those in FIG. 1C. In some embodiments, at least one first layer 104P extends to overlap the readout circuit 120. i.e., the transistors 150, 160 and 170. In some embodiments, a ratio D3/D0 is between about 0.05 and about 0.25, wherein the length D0 is a length of one side of the first layer 104P. In some embodiments, the first layers 104P of the four unit pixels form a ring surrounding the floating diffusion region 126. In some embodiments, the ring of the first layers 104P is separate from the floating diffusion region 126. Referring to FIG. 6D, the second layers 104N of the four unit pixels are separated from each other and are depicted as four disjoined dotted regions. Each second layer 104N has a polygonal shape, such as a rectangular shape. In some embodiments, each second layer 104N extends below the respective horizontal portion 130H and the vertical portion 130V. In some embodiments, each second layer 104N of the four unit pixels fully overlaps a respective electrode gate 130G of the transfer transistor 130, including the respective horizontal portion 130H and the vertical portion 130V. In some embodiments, each second layer 104N of the four unit pixels at least partially overlaps the floating diffusion region 126.

In accordance with some embodiments of the present disclosure, an image sensor semiconductor device includes a semiconductor substrate and a first photodiode disposed in the semiconductor substrate and configured to generate charges in response to radiation. The image sensor semiconductor device also includes a first transistor disposed adjacent to the first photodiode, and a second transistor disposed over the first photodiode, wherein the first transistor and the second transistor are configured to generate at least one electric field to move the charges generated by the first photodiode. The image sensor device further includes a floating diffusion region configured to store the moved charges.

In accordance with some embodiments of the present disclosure, an image sensor semiconductor device includes a semiconductor substrate and a plurality of unit pixels. Each of the plurality of unit pixels comprises a first photodiode disposed in the semiconductor substrate and configured to generate charges in response to radiation, a first transistor disposed over the first photodiode, and a second transistor disposed over the first photodiode. At least one of the first transistor and the second transistor is configured to generate an electric field moving charges generated by the first photodiode.

In accordance with some embodiments of the present disclosure, a method includes configuring a photodiode to generate charges in response to radiation; biasing a first transistor to generate a first electric field that transfers a first portion of the charges from the photodiode to a floating diffusion region in a first period; and biasing a second transistor to generate a second electric field that transfers a second portion of the charges to the floating diffusion region or a source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a semiconductor substrate;
   a first photodiode disposed in the semiconductor substrate and configured to generate charges in response to radiation;
   a first transistor disposed adjacent to the first photodiode;
   a floating diffusion region configured to store the generated charges;
   a reset transistor configured to reset the floating diffusion region; and
   a second transistor disposed over the first photodiode, and the second transistor also disposed between the reset transistor and the floating diffusion region,
   wherein the first transistor and the second transistor are configured to generate a first electric field and a second electric field, respectively, to move the charges generated by the first photodiode to the floating diffusion region,
   wherein the first transistor and the second transistor are enabled by a first pulse and a second pulse, respectively, during a shutter operation, wherein the first pulse and the second pulse have a same polarity,
   wherein the first transistor and the second transistor are further enabled by a third pulse and a fourth pulse, respectively, during a readout operation for providing a voltage in response to a potential at the floating diffusion region, and the third pulse and the fourth pulse have opposite polarities,
   wherein the second transistor and the floating diffusion region are disposed on opposite sides of the first photodiode.

2. The image sensor device according to claim 1, wherein the second transistor is further configured to generate a third electric field to move the charges to a source/drain region of the second transistor.

3. The image sensor device according to claim 1, further comprising an amplifier transistor and a readout transistor configured to provide a voltage in response to the charges stored in the floating diffusion region.

4. The image sensor device according to claim 1, wherein the first transistor and the second transistor are disposed on diagonally opposite sides of the first photodiode.

5. The image sensor device according to claim 1, wherein the first pulse is offset from the second pulse.

6. The image sensor device according to claim 1, wherein the third pulse is synchronous with the fourth pulse during the readout operation.

7. The image sensor device according to claim 1, wherein the second transistor comprises a source region or a drain region configured to generate the second electric field during the readout operation.

8. The image sensor device according to claim 1, further comprising a second photodiode in the semiconductor substrate, wherein the first photodiode and the second photodiode are stacked in a depth direction of the semiconductor substrate.

9. The image sensor device according to claim 8, further comprising a channel in the semiconductor substrate, wherein each of the first photodiode and the second photodiode comprises a first layer having a first dopant type and a second layer having a second dopant type, and the channel is surrounded by the first photodiode, the second photodiode and the first transistor.

10. The image sensor device according to claim 9, further comprising an isolation structure laterally surrounding the second layer of the second photodiode.

11. The image sensor device according to claim 8, wherein the second transistor at least partially overlaps the second photodiode vertically.

12. An image sensor device, comprising:
a semiconductor substrate;
a plurality of unit pixels;
a floating diffusion region disposed at a center of the plurality of unit pixels; and
a reset transistor adjacent to the plurality of unit pixels and configured to reset the floating diffusion region;,
wherein each of the plurality of unit pixels comprises:
a first photodiode disposed in the semiconductor substrate and configured to generate first charges in response to radiation;
a second photodiode configured to generate second charges in response to the radiation;
a first transistor disposed over the first photodiode; and
a second transistor disposed over the first photodiode, wherein the second transistor is also disposed between the reset transistor and the floating diffusion region, the first transistor and the second transistor being configured to generate an electric field moving the first charges generated by the first photodiode to the floating diffusion,
wherein the floating diffusion region is configured to store the first and second charges generated by the plurality of unit pixels, and wherein the first transistor and the second transistor are enabled by a first pulse and a second pulse, respectively, during a shutter operation, wherein the first pulse and the second pulse have a same polarity, wherein the first transistor and the second transistor are further enabled by a third pulse and a fourth pulse, respectively, during a readout operation for providing a voltage in response to a potential at the floating diffusion region, wherein the third pulse and the fourth pulse have opposite polarities.

13. The image sensor device according to claim 12, wherein the floating diffusion region is further configured to receive the second charges generated by each of the second photodiodes.

14. The image sensor device according to claim 13, wherein each of the second photodiodes comprises a first layer having a first dopant type and a second layer having a second dopant type, and the first layers of the second photodiodes in adjacent unit pixels are joined to each other.

15. A method of operating an image sensor device, the method comprising:
configuring a photodiode to generate charges in response to radiation;
biasing a first transistor by a first pulse to generate a first electric field that transfers a first portion of the charges from the photodiode to a floating diffusion region in a first period during a shutter operation; and
biasing a second transistor by a second pulse to generate a second electric field that transfers a second portion of the charges from the photodiode to a source or a drain region of the second transistor during the shutter operation, wherein the second transistor and the floating diffusion region are disposed on opposite sides of the photodiode, and the second transistor is disposed over the first photodiode and also is disposed between the reset transistor and the floating diffusion region,
wherein the first pulse and the second pulse have a same polarity,
wherein the first transistor and the second transistor are further enabled by a third pulse and a fourth pulse, respectively, during a readout operation for providing a voltage in response to a potential at the floating diffusion region, and the third pulse and the fourth pulse have opposite polarities.

16. The method according to claim 15, wherein the third pulse is synchronous with the fourth pulse during the readout operation.

17. The method according to claim 15, wherein the first pulse is offset from the second pulse during the shutter operation.

* * * * *